(12) United States Patent
Suzuki et al.

(10) Patent No.: US 11,300,593 B2
(45) Date of Patent: Apr. 12, 2022

(54) SEMICONDUCTOR COMPONENT, ASSEMBLY AND METHOD FOR MANUFACTURING SEMICONDUCTOR COMPONENT

(71) Applicant: SHINDENGEN ELECTRIC MANUFACTURING CO., LTD., Tokyo (JP)

(72) Inventors: Kenichi Suzuki, Saitama (JP); Kazuyuki Sashida, Saitama (JP); Mizue Yamaji, Saitama (JP); Kenichi Yoshida, Saitama (JP); Shinji Kunori, Saitama (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 0 days.

(21) Appl. No.: 16/766,648

(22) PCT Filed: Nov. 24, 2017

(86) PCT No.: PCT/JP2017/042130
§ 371 (c)(1),
(2) Date: May 22, 2020

(87) PCT Pub. No.: WO2019/102569
PCT Pub. Date: May 31, 2019

(65) Prior Publication Data
US 2020/0386795 A1 Dec. 10, 2020

(51) Int. Cl.
*G01R 19/00* (2006.01)
*G01R 15/12* (2006.01)
*G01R 15/18* (2006.01)

(52) U.S. Cl.
CPC ......... *G01R 19/0092* (2013.01); *G01R 15/12* (2013.01); *G01R 15/181* (2013.01)

(58) Field of Classification Search
CPC ............ G01R 15/12; G01R 15/18; H01F 5/00
See application file for complete search history.

(56) References Cited

U.S. PATENT DOCUMENTS 7,078,888 B2 * 7/2006 Budillon .............. G01R 15/181
324/127
7,106,162 B2 9/2006 Saito
(Continued)

FOREIGN PATENT DOCUMENTS

CN   102087903 A   6/2011
CN   102543411 A   7/2012
(Continued)

OTHER PUBLICATIONS

International Search Report in the international application No. PCT/JP2017/042130, dated Feb. 5, 2018, and its English translation provided by WIPO.
(Continued)

*Primary Examiner* — Dominic E Hawkins
(74) *Attorney, Agent, or Firm* — Ladas & Parry, LLP

(57) ABSTRACT

A semiconductor component 150 has a semiconductor layer 1 including a winding wire part 10 and a winding return wire part 50 connected at a terminal end part of the winding wire part 10 and returning from the terminal end part toward a starting end part side, wherein the semiconductor component is disposed so as to surround an object to be measured.

16 Claims, 20 Drawing Sheets

(56) References Cited

U.S. PATENT DOCUMENTS

| | | | |
|---|---|---|---|
| 8,742,539 B2 | 6/2014 | Weyers et al. | |
| 2003/0214313 A1 | 11/2003 | Omura et al. | |
| 2004/0257061 A1 | 12/2004 | De Buda | |
| 2005/0253573 A1 | 11/2005 | Budillon et al. | |
| 2014/0210463 A1* | 7/2014 | Klein | G01R 33/05 324/253 |
| 2016/0154034 A1 | 6/2016 | Buck et al. | |
| 2019/0154733 A1* | 5/2019 | Joo | G01R 15/18 |
| 2019/0311835 A1* | 10/2019 | Miller | G01R 15/181 |
| 2020/0373923 A1* | 11/2020 | Walsh | G01V 3/102 |

FOREIGN PATENT DOCUMENTS

| | | |
|---|---|---|
| CN | 104284515 A | 1/2015 |
| CN | 106062570 A | 10/2016 |
| CN | 106384643 A | 2/2017 |
| JP | H10247718 A | 9/1998 |
| JP | 2001102230 A | 4/2001 |
| JP | 2002221538 A | 8/2002 |
| JP | 2003315373 A | 11/2003 |
| JP | 2005326418 A | 11/2005 |
| JP | 2012088224 A | 5/2012 |
| KR | 101127478 B1 | 3/2012 |
| WO | 2017010009 A1 | 1/2017 |

OTHER PUBLICATIONS

Written Opinion of the International Searching Authority in the international application No. PCT/JP2017/042130, dated Feb. 5, 2018 and English translation provided by Google Translate.
Extended European Search Report from EP app. No. 17932972.7, dated May 21, 2021.
Notice of Reason for Refusal from JP app. No. 2019-556036, dated Jun. 1, 2021, with English translation from Global Dossier.
Gerber et al., "Gate Unit with Improved Short-Circuit Detection and Turn-Off Capability for 4.5-kV Press-Pack IGBTs Operated at 4-kA Pulse Current", IEEE Transactions on Plasma Science, vol. 41, No. 10, Oct. 2013, pp. 2641-2648.
Notice of Reason for Refusal from JP app. No. 2019-556036, dated Dec. 7, 2021, with machine English translation from Global Dossier, all pages.
First Office Action and Search Report from CN app. No. 201780097068.8, dated Nov. 22, 2021, with machine English translation from Global Dossier, all pages.

* cited by examiner

SEMICONDUCTOR COMPONENT, ASSEMBLY AND METHOD FOR MANUFACTURING SEMICONDUCTOR COMPONENT

TECHNICAL FIELD

The present invention relates to a semiconductor component and an assembly having a winding wire part in a semiconductor layer, and a method for manufacturing a semiconductor component.

BACKGROUND ART

Conventionally, a current detection sensor using a Rogowski coil has been known. The Rogowski coil is a coreless coil, and has a winding core, a winding wire wound around the winding core, and a return wire connected to the terminal end part of the winding wire and returning to a starting end part side (for example, see JP 2012-88224 A). In addition, the Rogowski coil is connected to an integrator, and a change in current in an object to be measured can be measured by integrating the output voltage with the integrator. In such a Rogowski coil, the sensitivity is increased with an increase in the number of turns per unit distance.

Meanwhile, a sensor has been proposed which detects a change in current flowing through a semiconductor device (for example, a switching element). However, conventional sensors cannot detect a change in current flowing through the semiconductor device with sufficient accuracy, and there is a problem that the size of the entire device including the sensor may be increased.

SUMMARY OF INVENTION

Problem to be Solved by Invention

The present invention provides a semiconductor component, a combination, and a method of manufacturing the semiconductor component capable of accurately detecting an operation without an excessive increase in size.

Means to Solve the Problem

A semiconductor component according to the present invention may comprise:
a semiconductor layer including a winding wire part and a winding return wire part connected at a terminal end part of the winding wire part and returning from the terminal end part toward a starting end part side, wherein
the semiconductor component may be disposed so as to surround an object to be measured.

In the semiconductor component according to the present invention,
the winding return wire part may not pass through the winding wire part.

In the semiconductor component according to the present invention,
the semiconductor component may have a plurality of measurement units,
each measurement unit may have the winding wire part and the winding return wire part,
the terminal end part of the winding wire part of one measurement unit may be connected to the starting end part of the winding wire part of another measurement unit, and the starting end part of the winding return wire part of the one measurement unit may be connected to the terminal end part of the winding return wire part of the other measurement unit.

In the semiconductor component according to the present invention,
the measurement unit may have a columnar shape.

In the semiconductor component according to the present invention,
the object to be measured may be an electronic device, and
a plurality of measurement units may be disposed so as to laterally surround the electronic device.

In the semiconductor component according to the present invention,
the object to be measured may be a detection target part, through which at least a part of current flowing in an electronic device flows, and
the semiconductor component may be disposed so as to surround the detection target part.

In the semiconductor component according to the present invention,
the object to be measured may be a detection target part, through which at least a part of current flowing in an electronic device flows, and
the semiconductor component may have the detection target part, and the winding wire part and the winding return wire part, which are disposed so as to surround the detection target part.

An Assembly according to the present invention may comprise:
a semiconductor component, which has a semiconductor layer including a winding wire part and is disposed so as to surround an object to be measured; and
a winding return wire connected at a terminal end part of the winding wire part and returning from the terminal end part toward a starting end part side.

A method of manufacturing a semiconductor component, according to the present invention, may comprise steps of:
forming a first insulating film partially on a semiconductor layer;
forming a trench using the first insulating film;
forming a second insulating film on an inner side wall and an inner bottom surface of the trench;
providing a conductive material in the trench where the second insulating film is formed and on one side of the semiconductor layer;
forming a winding wire part and a winding return wire part inward or outward of a periphery of the winding wire part by patterning the conductive material; and
covering the winding wire part and the winding return wire part with a third insulating film.

Effects of Invention

In the present invention, the winding wire part is provided in the semiconductor layer. Thus, the configuration of the winding wire part can be miniaturized by utilizing the technique for manufacturing the semiconductor device, and the number of turns per unit length can be increased. Therefore, a change in current can be detected accurately. Further, since such miniaturization is possible, a semiconductor component having a small size can be provided. Further, by providing a semiconductor component as in the present invention, it is possible to detect an operation of an existing semiconductor device or the like, and to realize high versatility.

BRIEF DESCRIPTION OF DRAWINGS

FIG. 3(a) does not show the right part of FIGS. 3(b) and (c) because it shows a longitudinal section different from that of FIG. 3(b).

FIG. 4(a) does not show the right part of FIGS. 4(b) and (c) because it shows a longitudinal section different from that of FIG. 4(b).

DESCRIPTION OF EMBODIMENTS

First Embodiment

<<Configuration>>

Figure 2:
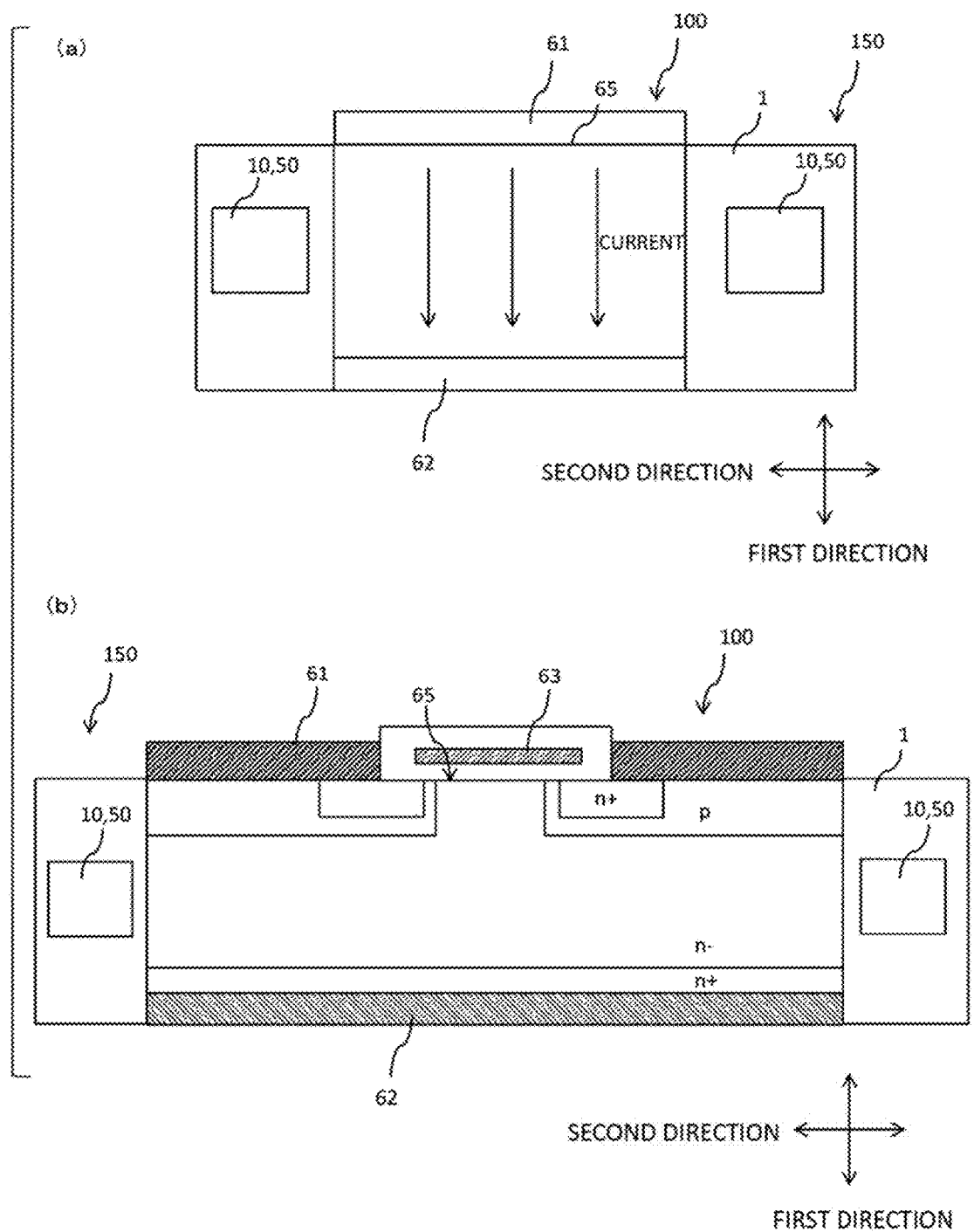
FIG. 2(a) is a longitudinal sectional view of a semiconductor component and a semiconductor device that can be used in the first embodiment of the present invention.
FIG. 2(b) is a longitudinal sectional view of another semiconductor component and another semiconductor device that can be used in the first embodiment of the present invention.

A semiconductor component, a combination, and a method of manufacturing the semiconductor component according to the present embodiment will be described. In the present embodiment, "one side" means the upper side in FIG. 2 and "other side" means the lower side in FIG. 2. Further, the vertical direction in FIG. 2 (the direction from the other side toward one side and the direction from one side toward the other side) is referred to as a "first direction", the horizontal direction in FIG. 2 is referred to as a "second direction", and the front-back direction of the page of FIG. 2 is referred to as a "third direction". An in-plane direction including the second direction and the third direction is referred to as a "plane direction", and a state where the view from the upper side in FIG. 2 is referred to as a "plan view".

Figure 1:
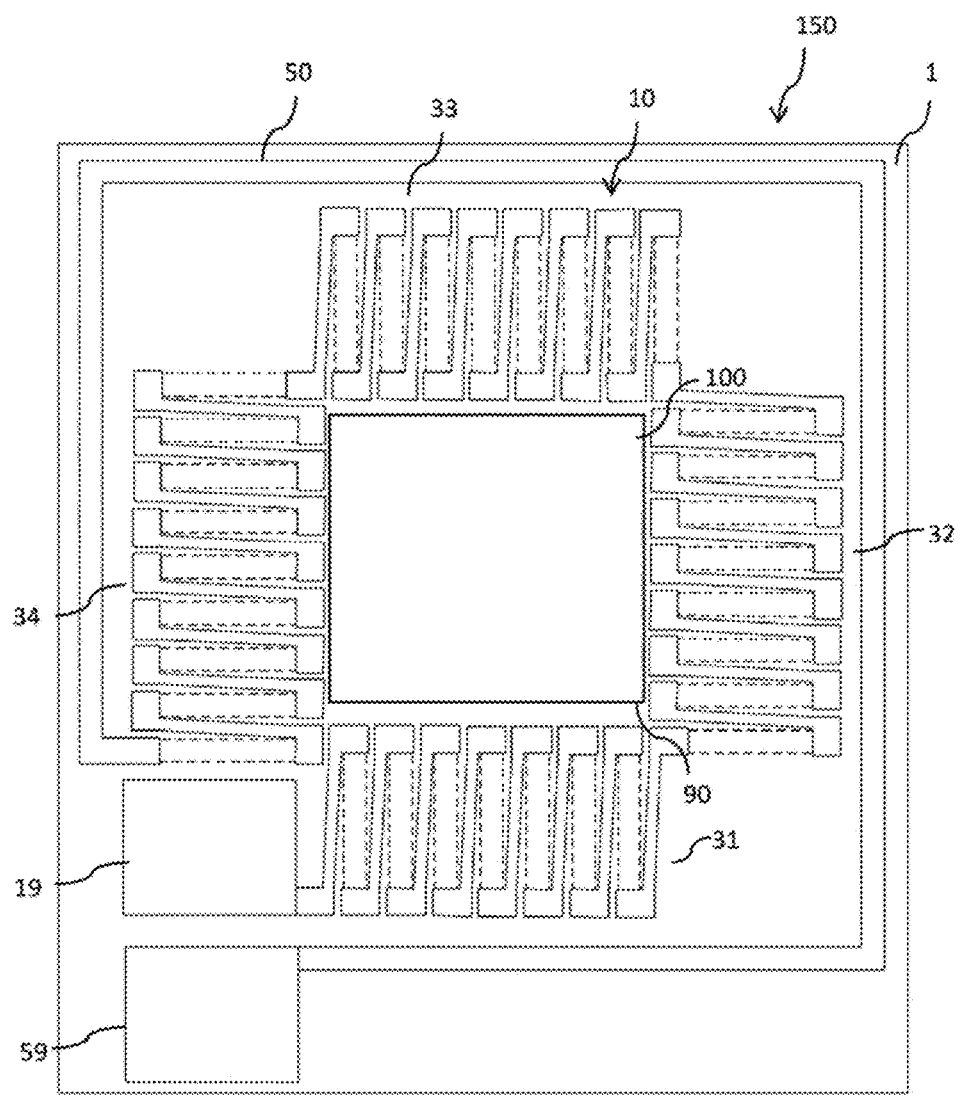
FIG. 1 is a plan view of a semiconductor component that can be used in a first embodiment of the present invention.

As shown in FIG. 1, a semiconductor component 150 of the present embodiment may have a semiconductor layer 1 including a winding wire part 10 and a winding return wire part 50 connected at the terminal end part of the winding wire part 10 and returning from the terminal end part toward the starting end part side. The semiconductor component 150 is disposed so as to surround the object to be measured. An object to be measured may be, for example, as shown in FIG. 2, the semiconductor device 100 having the first electrode 61 provided on the first main surface of the semiconductor layer 65 and the second electrode 62 provided on the second main surface. In this case, by arranging the semiconductor component 150 so as to laterally surround the semiconductor device 100 as shown in FIG. 2, the winding wire part 10 and the winding return wire part 50 can be positioned so as to surround the current flowing between the first electrode 61 and the second electrode 62. In FIG. 2, the upper face of the semiconductor layer 65 is the first main surface, and the lower face is the second main surface. FIG. 1 shows an aspect in which the semiconductor device 100 is placed in an opening 90 provided in the semiconductor component 150. Note that an object to be measured does not need to be a semiconductor device, but may be an electronic device that does not use a semiconductor. In FIG. 2, reference numerals "10, 50" are used, which means that a quasi Rogowski coil may be used or a Rogowski coil may be used.

As a material of a semiconductor constituting the semiconductor layer 1, a material such as silicon, silicon carbide, gallium nitride, or the like can be used. FIG. 2(a) shows an aspect in which the current flows from the upper side toward the lower side. However, this is merely an example, and the current may flow from the lower side toward the upper side.

The winding wire part 10 and the winding return wire part 50 may be formed of a semiconductor material such as polysilicon, but not limited thereto. They may be formed of a metal material such as copper and aluminum, and the metal film may be the winding wire part 10 and the winding return wire part 50.

The winding return wire part 50 may not to pass through the winding wire part 10. In the present embodiment, the winding return wire part 50 is disposed to surround the outward of the periphery of the winding wire part 10 as shown in FIG. 1. The inside of the winding wire part 10 may be filled with an insulating material such as an oxide film (see a later-described third insulating film 93 shown in FIG. 3).

Figure 9:
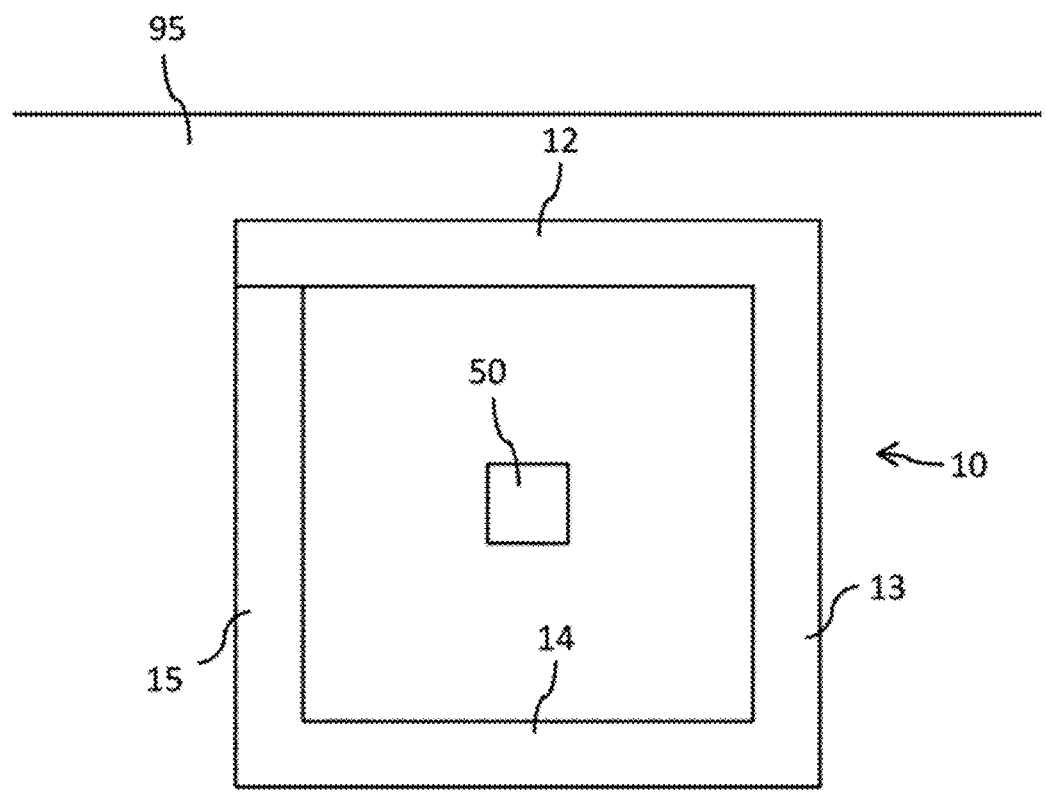
FIG. 9 is a longitudinal sectional view of still another semiconductor component that can be used in the first embodiment of the present invention.

Although FIG. 1 shows the aspect in which the winding return wire part 50 does not pass through the winding wire part 10, the present invention is not limited thereto, and the winding return wire part 50 may pass through the winding wire part 10 as shown in FIG. 9. In the present embodiment, the aspect shown in FIG. 1 is referred to as a "quasi Rogowski coil" and the aspect shown in FIG. 9 is referred to as a "Rogowski coil".

Figure 3:
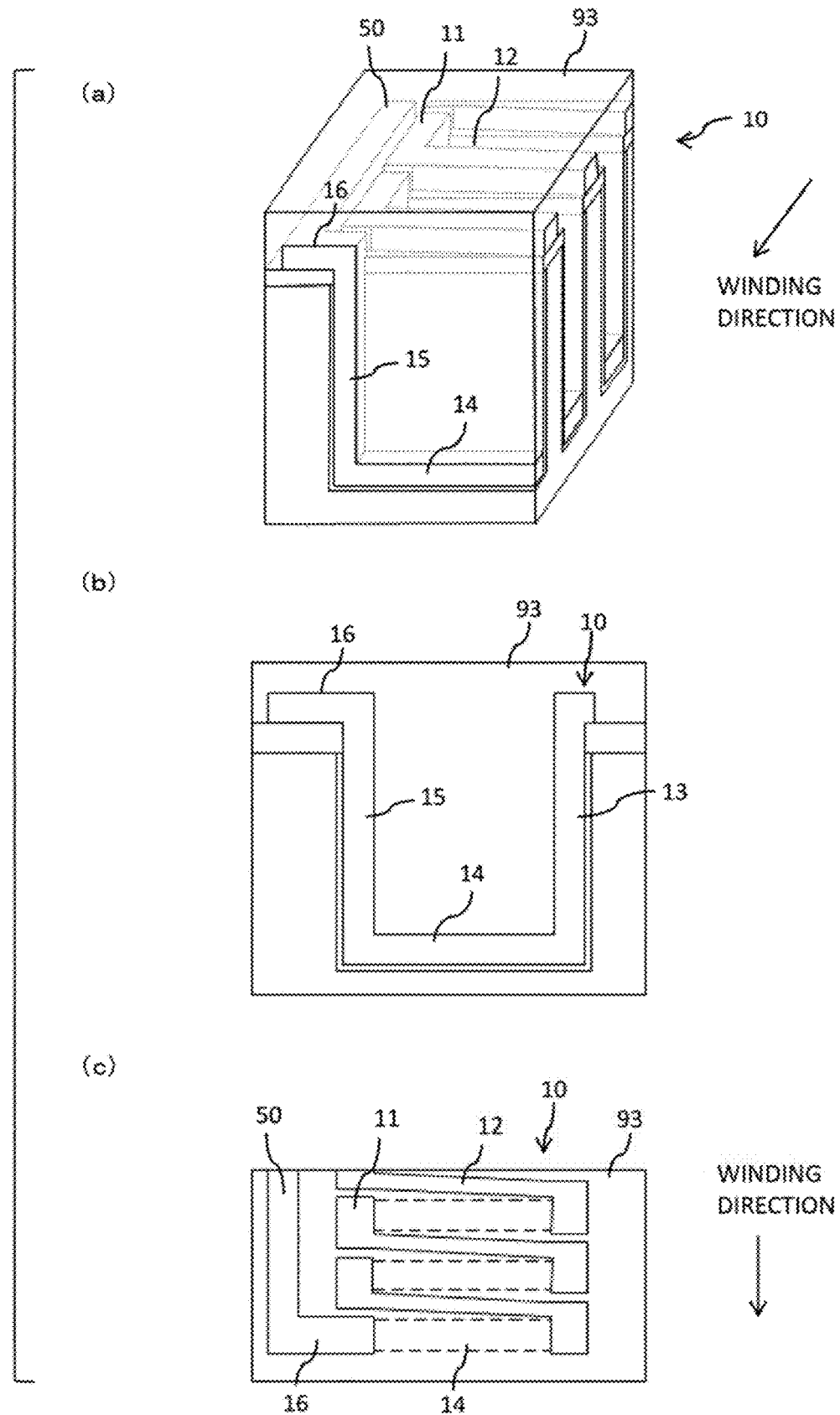
FIG. 3(a) is a perspective view of a semiconductor component that can be used in the first embodiment of the present invention.
FIG. 3(b) is a longitudinal sectional view of the semiconductor component shown in FIG. 3(a)
FIG. 3(c) is a plan view of the semiconductor component shown in FIG. 3(a).

As shown in FIG. 3, the winding wire part 10 may have: a first straight part 11 along a winding direction; a second straight part 12 extending toward the peripherally inward (to the right in FIG. 3) from the end of the first straight part 11 and extending in a plane direction (direction including the second direction and the third direction) along the winding direction; a third straight part 13 extending from one side toward the other side from the end of the second straight part 12; a fourth straight part 14 extending toward the peripherally outward (to the left side in FIG. 3) from the end of the third straight part 13 and extending in the plane direction along the direction perpendicular to the winding direction; and a fifth straight part 15 extending from the other side toward one side from the end of the fourth straight part 14 (first aspect). Further, a sixth straight part 16 extending toward the peripherally outward from the end of the fifth straight part 15 in the plane direction may be provided at the terminal end part of the winding wire part 10, and the end of the sixth straight part 16 and the starting end part of the winding return wire part 50 may be connected to each other. The winding return wire part 50 may extend in the plane direction.

Unlike the aspect described above, the winding wire part 10 may have: a first straight part 11 along a winding direction; a second straight part 12 extending toward the peripherally inward from the end of the first straight part 11 and extending in a plane direction along the winding direction; a third straight part 13 extending from the other side toward one side from the end of the second straight part 12; a fourth straight part 14 extending toward the peripherally outward from the end of the third straight part 13 and extending in the plane direction along the direction perpendicular to the winding direction; and a fifth straight part 15 extending from one side toward the other side from the end of the fourth straight part 14 (second aspect). Further, a sixth straight part 16 extending toward the peripherally outward from the end of the fifth straight part 15 in the plane direction may be provided at the terminal end part of the winding wire part 10, and the end of the sixth straight part 16 and the starting end part of the winding return wire part 50 may be connected to each other. The winding return wire part 50 may extend in the plane direction.

Considering that the manufacturing method to be described later is adopted, it is advantageous to use the first aspect described firstly instead of the second aspect described secondly, because the winding return wire part 50 can be positioned on one side, which leads to simplified manufacturing process.

In the above aspect, the description has been given using the "straight part" as the line part. That is, although the description is made using an aspect in which a first straight part 11 is used as an example of a first line part, a second straight part 12 is used as an example of a second line part, a third straight part 13 is used as an example of a third line part, a fourth straight part 14 is used as an example of a fourth line part, a fifth straight part 15 is used as an example of a fifth line part, and a sixth straight part 16 is used as an example of a sixth line part, but the present invention is not limited to this. Each line part may be a curved line, or only part of the plurality of line parts may be a straight part. In addition, from the viewpoint of easiness of the manufacturing process, it is advantageous that the second line part and the fourth line part are straight parts, that is, it is advantageous that the second line part and the fourth line part are the second straight part 12 and the fourth straight part 14.

In the above aspect, when viewed in the longitudinal section, an aspect is provided in which the rectangular shape is formed by the second straight part 12, the third straight part 13, the fourth straight part 14, and the fifth straight part 15 (see FIGS. 3 and 9), but the present invention is not limited to such an aspect. It may be triangular, or it may be a polygon (pentagon or more) having more corners when viewed in the longitudinal section.

The first electrode 61 may be provided on a first main surface, and the second electrode 62 may be provided on a second main surface. The semiconductor device 100 may be a switching element, and may be, for example, a vertical MOSFET. When the aspect of the present embodiment is adopted for the vertical MOSFET as shown in FIG. 2(b), the first electrode 61 may be a source electrode and the second electrode 62 may be a drain electrode. A quasi Rogowski coil may be provided so as to surround the current flowing between the source electrode and the drain electrode. Note that reference numeral 63 in FIG. 2(b) denotes a gate electrode.

Figure 10:
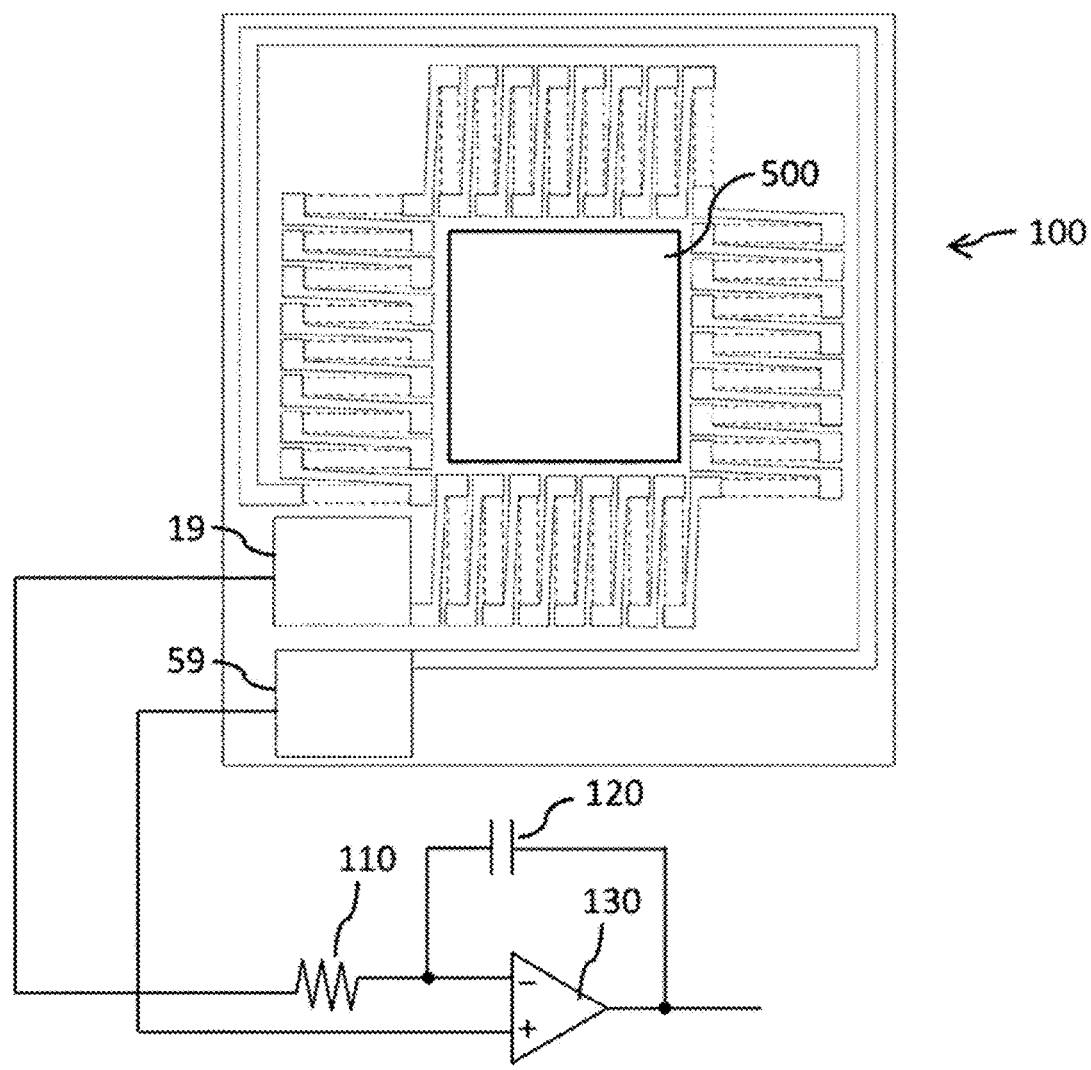
FIG. 10 is a diagram showing a relationship between a semiconductor component and an integration circuit that can be used in the first embodiment of the present invention.

As shown in FIG. 10, the winding return wire part 50 and the winding wire part 10 of the semiconductor layer 1 of the present embodiment may have an integration circuit by being connected to a resistor unit 110, a capacitor 120, and an operational amplifier 130 provided outside the semiconductor device 100. The invention is not limited to such an aspect, but the resistor unit 110, the capacitor 120, or the resistor unit 110 and the capacitor 120 of the integration circuit may be formed in the semiconductor layer 1. As an example, in FIG. 10, a winding wire electrode pad 19 connected to the starting end part of the winding wire part 10 is connected to the resistor unit 110, the resistor unit 110 is connected to the capacitor 120 and the inverting input terminal of the operational amplifier 130, and a winding return wire electrode pad 59 connected to the terminal end part of the winding return wire part 50 is connected to the non-inverting input terminal of the operational amplifier 130.

As shown in FIG. 1, the winding wire part 10 may have an A-direction winding wire part 31 extending in the second direction, a B-direction winding wire part 32 connected to the end of the A-direction winding wire part 31 and extending in the third direction, a C-direction winding wire part 33 connected to the end of the B-direction winding wire part 32 and extending in the second direction, and a D-direction winding wire part 34 connected to the end of the C-direction winding wire part 33 and extending in the third direction. When the aspect described above is employed, each of the winding wire parts 31 to 34 can be linearly formed, which is advantageous in that they can be manufactured relatively easily. The present embodiment describes the aspect using four direction winding wire parts 31 to 34. However, the present invention is not limited thereto, and three direction winding wire parts may be used to form a triangular shape in the plane direction, or five or more direction winding wire parts may be used to form a polygonal shape in the plane direction.

The A-direction winding wire part 31, the B-direction winding wire part 32, the C-direction winding wire part 33, and the D-direction winding wire part 34 may correspond to each other in length. The state where they correspond to each other in length indicates that the length of the A-direction winding wire part 31, the length of the B-direction winding wire part 32, the length of the C-direction winding wire part 33, and the length of the D-direction winding wire part 34 are respectively within the range of ±5% of the average value of the A-direction winding wire part 31, the B-direction winding wire part 32, the C-direction winding wire part 33, and the D-direction winding wire part 34. The numbers of turns included in the A-direction winding wire part 31, the B-direction winding wire part 32, the C-direction winding wire part 33, and the D-direction winding wire part 34 may be the same. Since the A-direction winding wire part 31 is connected to the winding-wire electrode pad 19, the number of turns of the A-direction winding wire part 31 may be less than the numbers of turns of the B-direction winding wire part 32, the C-direction winding wire part 33, and the D-direction winding wire part 34 by, for example, one, two, or more.

An object to be measured may be a detection target part 300 through which at least part of the current flowing in the semiconductor device 100 flows. As an example of this aspect, as shown in FIG. 11(a) the first electrode 61 or the second electrode 62 may be placed, a plate-shaped or sheet-shaped detection target part 300 that allows current from the electrodes 61 and 62 to flow between the first main surface and the second main surface may be provided, and the semiconductor component 150 may be provided so as to surround the detection target part 300. For the connection between the first electrode 61 or the second electrode 62 and the detection target part 300, for example, a conductive adhesive such as solder may be used, and any other connection means may be used. Further, an electrode or a terminal may be formed in the detection target part 300, and the electrode or the terminal may be connected to the first electrode 61 or the second electrode 62. The detection target part 300 may be placed on a substrate 390, for example.

When performing detection using part of the current flowing in the semiconductor device 100, the relationship between the current that actually flows and the current that flows in the detection target part 300 may be calculated or measured in advance. Using the result, the current actually flowing in the semiconductor device 100 may be measured from the current flowing in the detection target part 300.

Further, as another aspect of using the detection target part 300, as shown in FIG. 11(b), a semiconductor component 150 having the detection target part 300, and the winding wire part 10 and the winding return wire part 50 disposed so as to surround the detection target part 300 may be employed. More specifically, a flat plate-shaped part 160 including the detection target part 300, and the winding wire part 10 and the winding return wire part 50 disposed so as to surround the detection target part 300 may be used. In this case, the first electrode 61 or the second electrode 62 may be placed on the flat plate-shaped part 160, the current from the electrodes 61 and 62 may flow in the flat plate-shaped part 160, and the winding wire part 10 and the winding return wire part 50 may be provided at positions surrounding the path (the detection target part 300) through which the current flows. Note that FIG. 11(b) shows an aspect in which the drain electrode serving as the second electrode 62 is placed on the flat plate-shaped part 160. Further, the flat plate-shaped part 160 is an example of the semiconductor component 150, but the detection target part 300 provided in the flat plate-shaped part 160 does not necessarily need to be made of a semiconductor material.

<<Manufacturing Method>>

Next, an example of a method for manufacturing the semiconductor component 150 according to the present embodiment will be described.

Figure 4:
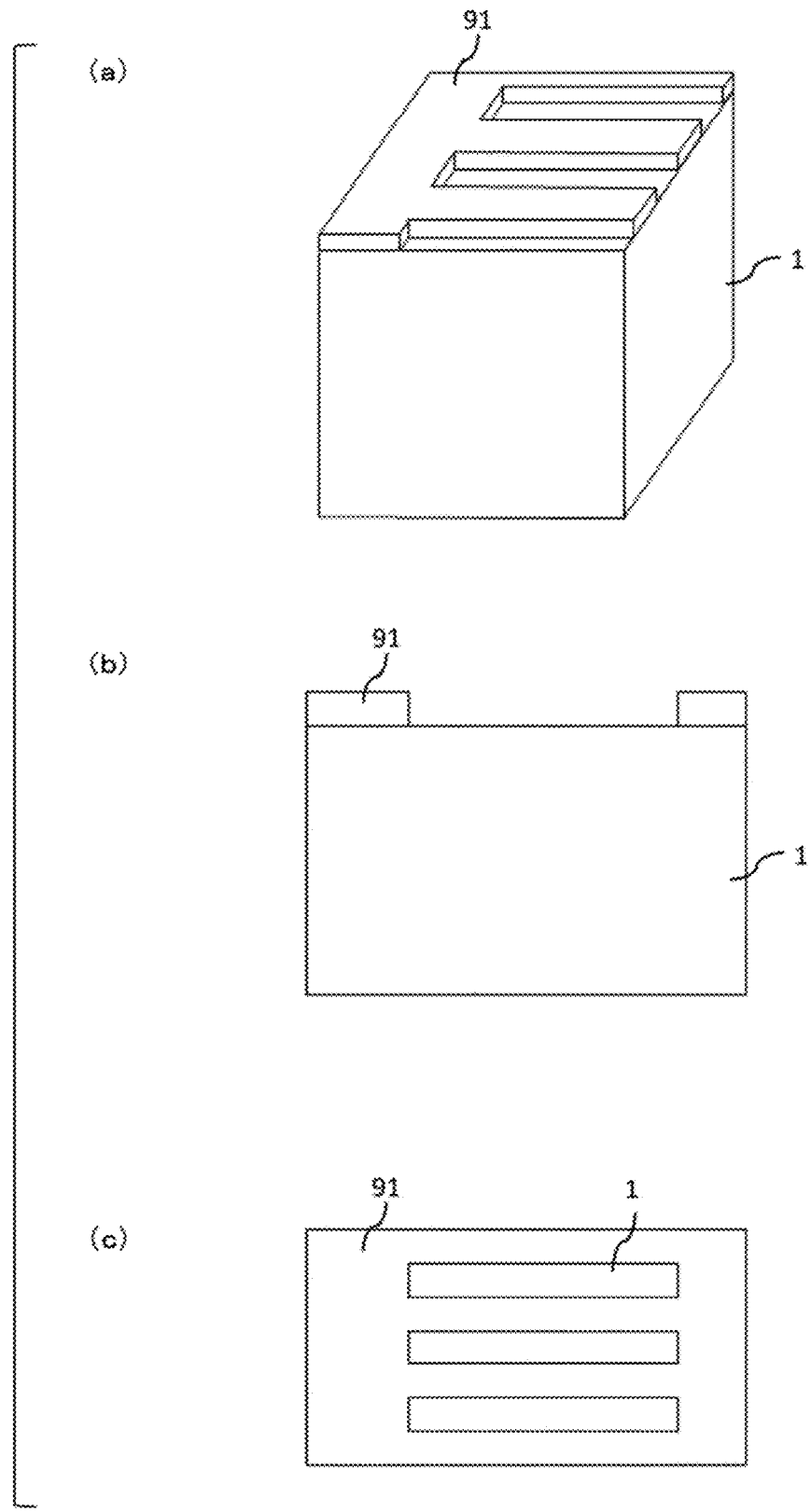
FIG. 4(a) is a perspective view for explaining a process of manufacturing a semiconductor component that can be used in the first embodiment of the present invention.
FIG. 4(b) is a longitudinal sectional view of the semiconductor component shown in FIG. 4(a)
FIG. 4(c) is a plan view of the semiconductor component shown in FIG. 4(a).

A first insulating film 91 made of an oxide film or the like is formed on the upper surface of the semiconductor layer 1 such as a wafer with a thermal oxide film or chemical vapor deposition (CVD) (see FIG. 4). Note that the first insulating film 91 also includes a resist film.

Next, a region for forming a trench is patterned by photolithography, and thereafter, the first insulating film 91 is dry etched (see FIG. 4).

Figure 5:
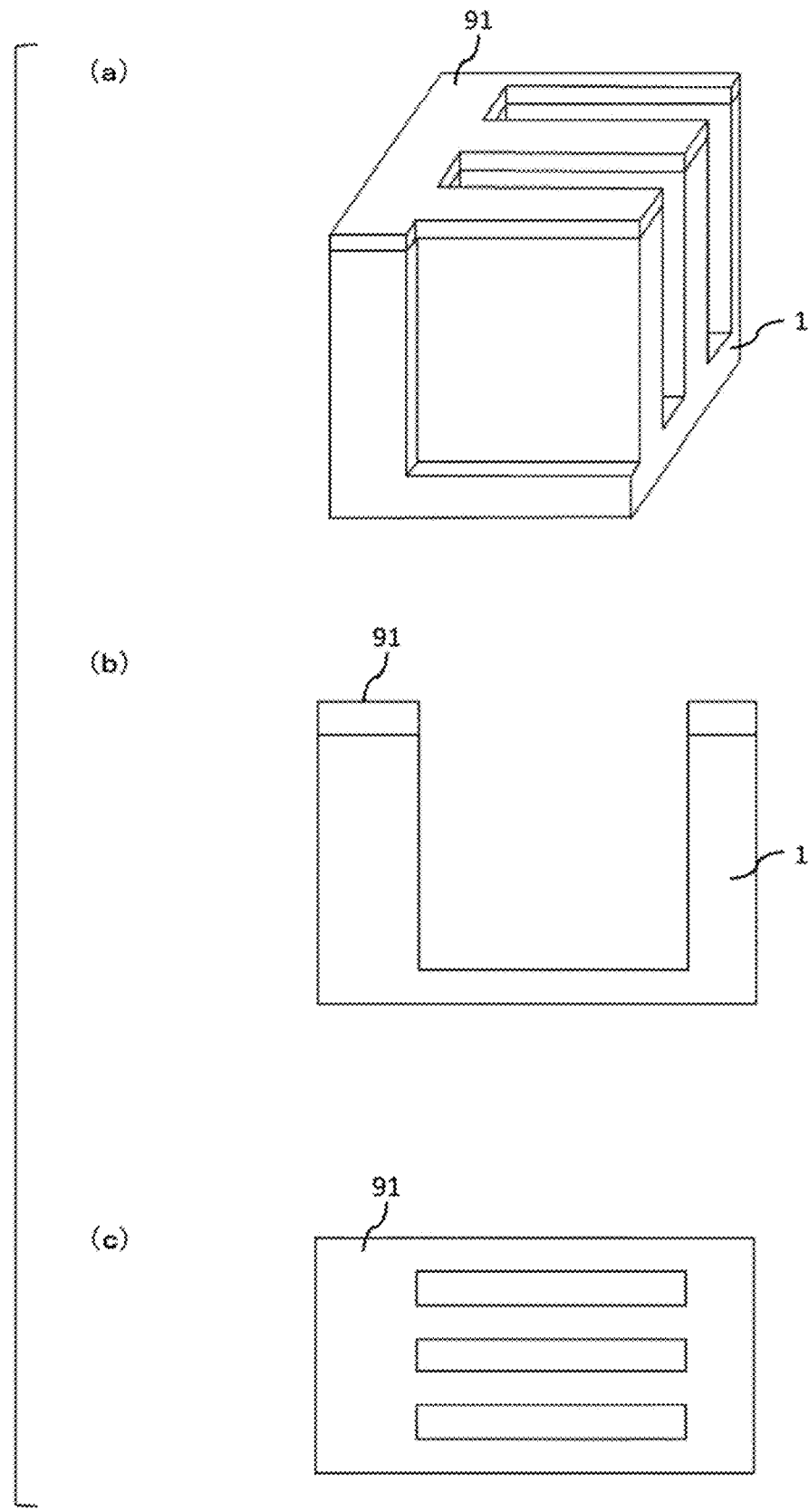
FIG. 5(a) is a perspective view for explaining a manufacturing process that has advanced from FIG. 4(a)
FIG. 5(b) is a longitudinal sectional view of the semiconductor component shown in FIG. 5(a)
FIG. 5(c) is a plan view of the semiconductor component shown in FIG. 5(a).

Then, the semiconductor layer 1 is dry etched using the first insulating film 91 as a mask (see FIG. 5). The damaged layer on the etched side wall may be removed by chemical dry etching (CDE), sacrificial oxide film, $H_2$ annealing, or the like.

Figure 6:
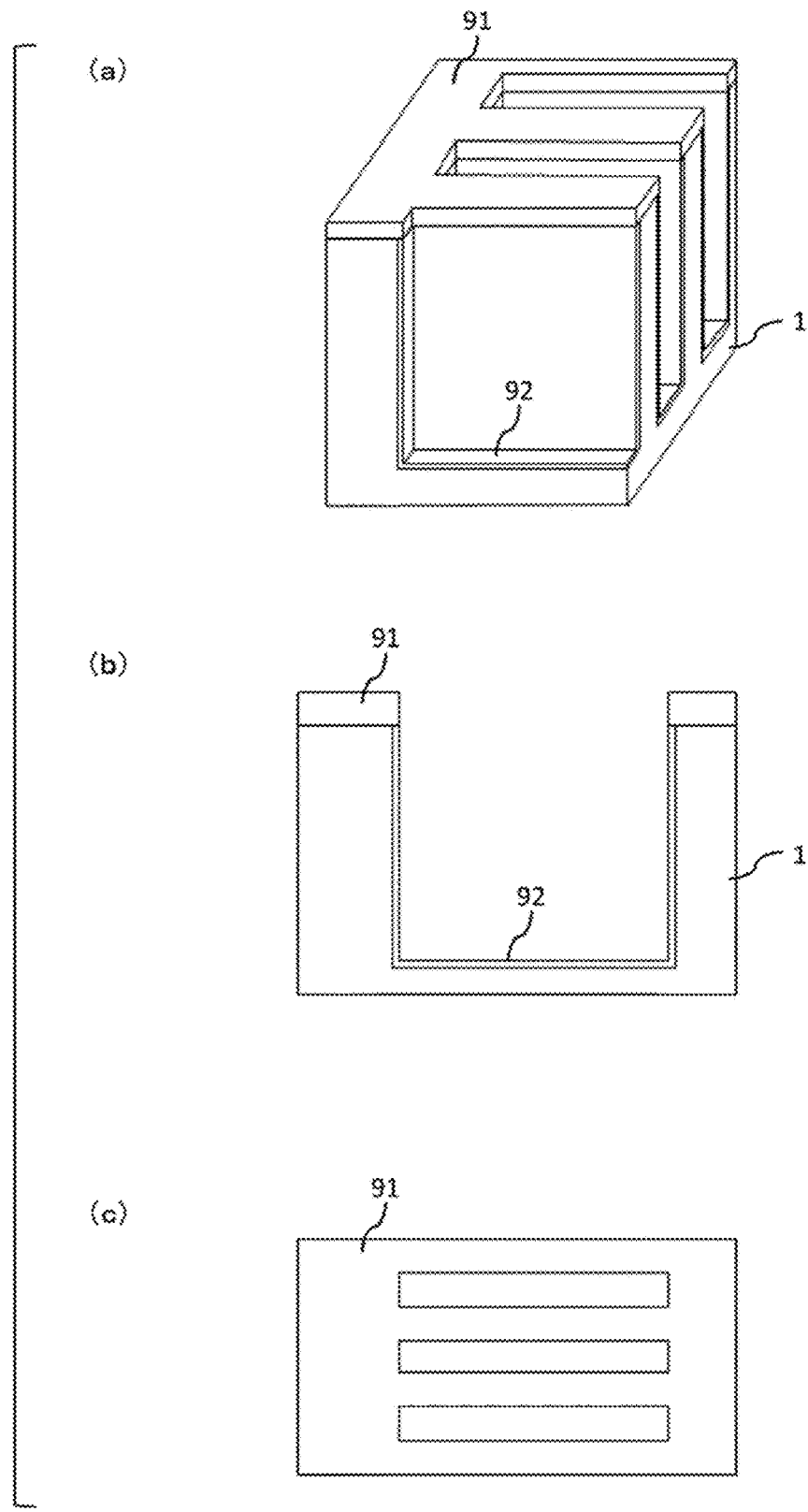
FIG. 6(a) is a perspective view for explaining a manufacturing process which has advanced from FIG. 5(a)
FIG. 6(b) is a longitudinal sectional view of the semiconductor component shown in FIG. 6(a)
FIG. 6(c) is a plan view of the semiconductor component shown in FIG. 6(a).

Next, a second insulating film 92 such as a thermal oxide film or a CVD oxide film is formed on the inner sidewall and the inner bottom surface of the trench (see FIG. 6). When the first insulating film 91 is composed of, for example, a resist film, the first insulating film 91 may be removed before the second insulating film 92 is formed, and then the second insulating film 92 may be formed, unlike this aspect.

Figure 7:
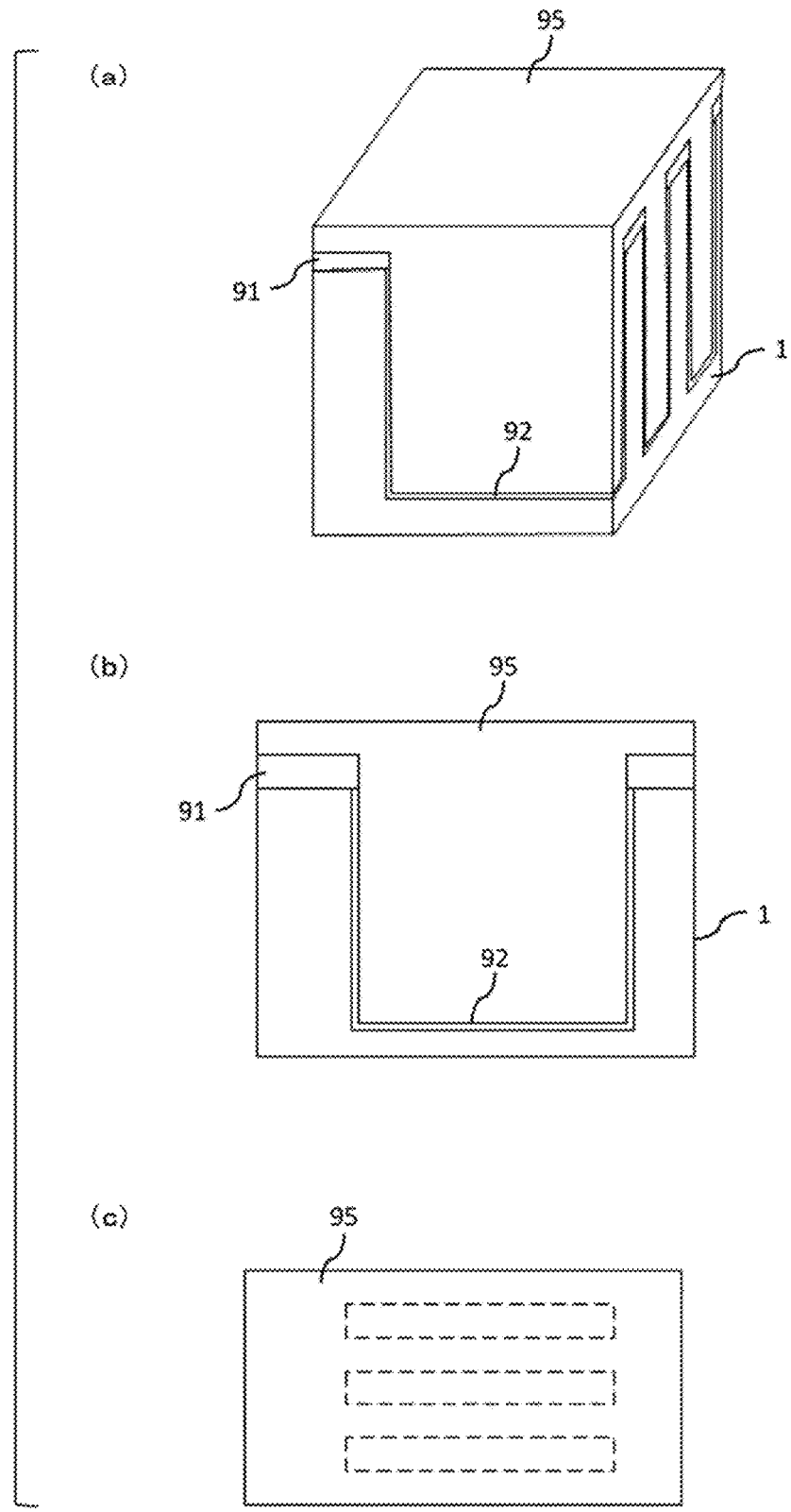
FIG. 7(a) is a perspective view for explaining a manufacturing process which has advanced from FIG. 6(a)
FIG. 7(b) is a longitudinal sectional view of the semiconductor component shown in FIG. 7(a)
FIG. 7(c) is a plan view of the semiconductor component shown in FIG. 7(a).

Then, the inside of the trench is filled with a conductive material 95 such as polysilicon, and the conductive material 95 such as polysilicon is also stacked on the upper surface of the first insulating film 91 (see FIG. 7). With this process, the conductive material 95 is provided inside the trench in which the second insulating film 92 is formed and on the first insulating film 91. In this case, the thickness of the conductive material 95 stacked on the first insulating film 91 may be, for example, about 0.5 µm to 2 µm.

Figure 8:
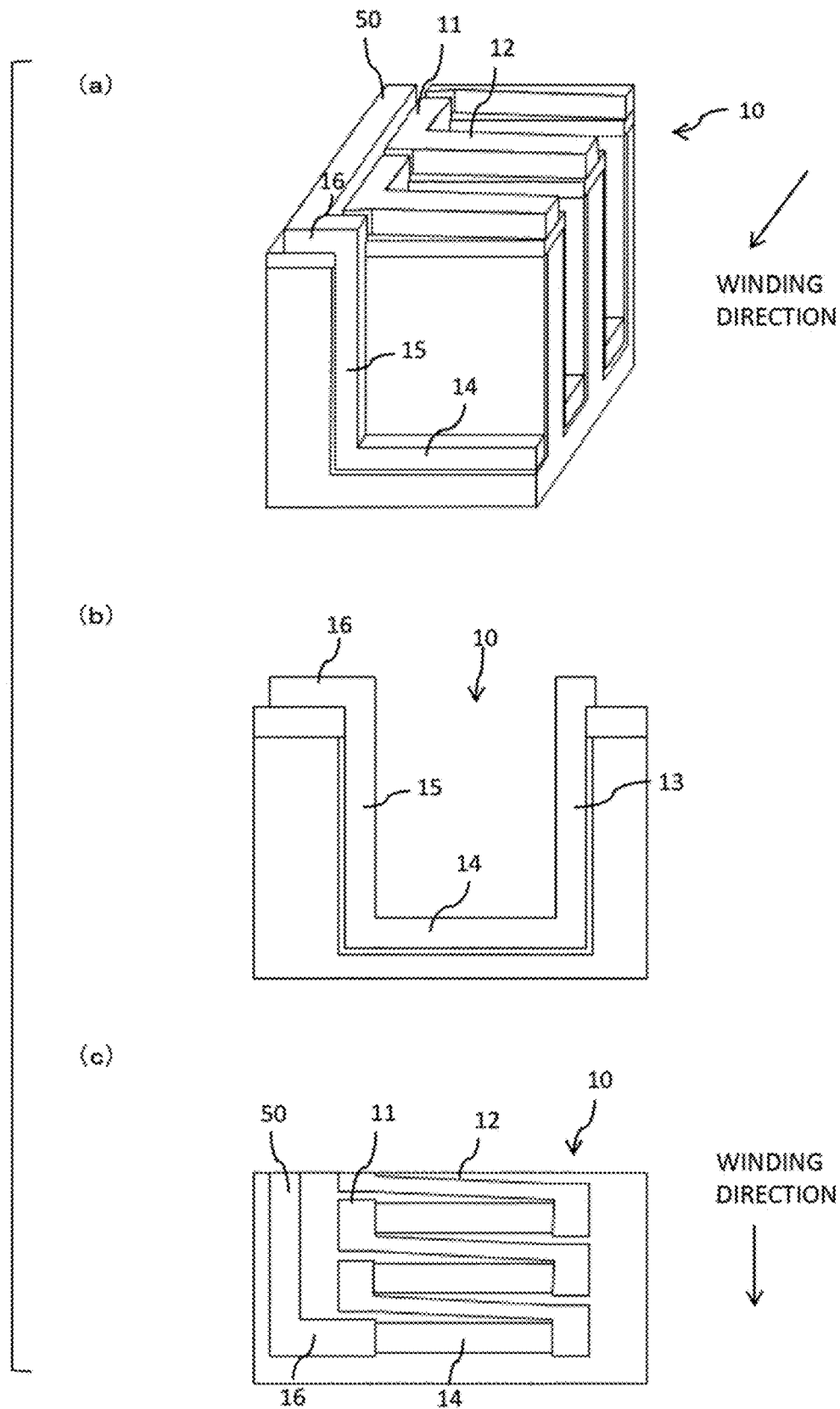
FIG. 8(a) is a perspective view for explaining a manufacturing process which has advanced from FIG. 7(a)
FIG. 8(b) is a longitudinal sectional view of the semiconductor device shown in FIG. 8(a)
FIG. 8(c) is a plan view of the semiconductor device shown in FIG. 8(a).

Next, patterning for forming the winding wire part 10 and the winding return wire part 50 is performed by photolithography (see FIG. 8). In this process, the thickness of the conductive material 95 remaining on the inner bottom surface and the inner side surface of the trench may be the same as the thickness of the conductive material 95 stacked on the first insulating film 91, and may be, for example, about 0.5 µm to 2 µm. Due to forming the conductive materials 95 to have the same thickness as described above, the current flowing through the respective straight parts 11 to 16 and the winding return wire part 50 can be made constant, which is advantageous in that the detection accuracy can be enhanced. The winding wire part 10 shown in FIG. 8 has the first straight part 11 along the winding direction, the second straight part 12 extending toward the peripherally inward from the end of the first straight part 11 and extending in the plane direction toward the winding direction, the third straight part 13 extending from the other side toward one side from the end of the second straight part 12, the fourth straight part 14 extending toward the peripherally outward from the end of the third straight part 13 and extending in the plane direction toward the direction perpendicular to the winding direction, the fifth straight part 15 extending from one side toward the other side from the end of the fourth straight part 14, and the sixth straight part 16 extending in the plane direction toward the peripherally outward from the end of the fifth straight part 15 at the terminal end part of the winding wire part 10. The winding return wire part 50 may extend in the plane direction.

Next, the inside of the trench is embedded with an insulating material such as an oxide film, and the insulating material is also stacked on the upper surface (see FIG. 3). More specifically, the third insulating film 93 such as an oxide film is embedded by CVD or spin on glass (SOG), and the third insulating film 93 such as an interlayer insulating film is provided on the upper surface.

Next, photolithography is performed to open a contact hole in the third insulating film 93 such as an interlayer insulating film at the starting end part of the winding wire part 10 and the terminal end part of the winding return wire part 50 formed of the conductive material 95 such as polysilicon. Thereafter, a contact hole is opened in the third insulating film 93 such as an interlayer insulating film by dry etching, and metal to be a PAD for an electrode wire or the like is formed at the portion where the contact hole is opened, so as to form the winding-wire electrode pad 19 and the return-wire electrode pad 59 (see FIG. 1).

<<Function and Effect>>

Subsequently, an example of the function and effect according to the present embodiment configured as described above will be described. All the aspects to be described in "function and effect" can be employed in the above configuration.

When the winding wire part 10 as in the present embodiment is used, the configuration of the winding wire part 10 can be miniaturized by utilizing the manufacturing technology of the semiconductor device 100, and the number of turns per unit length can be increased. Therefore, a change in current can be detected with high accuracy. Further, since miniaturization is possible in this manner, a small-sized semiconductor component 150 can be provided.

In addition, by providing the semiconductor component 150 having a Rogowski coil or a quasi Rogowski coil, the operation of an existing semiconductor device or the like can be detected, and high versatility can be realized.

The application of the aspect in which the winding return wire part 50 does not pass through the winding wire part 10 is significantly advantageous in that the manufacturing process can be facilitated. Specifically, when the aspect shown in FIG. 9 in which the winding return wire part 50 passes through the winding wire part 10 is employed, the process for forming the winding return wire part 50 inside the winding wire part 10 becomes complicated, which leads to an increase in manufacturing cost. On the other hand, when the winding return wire part 50 is not formed inside the winding wire part 10 as described with reference to FIGS. 3 to 8, the manufacturing process can be remarkably facilitated, and the manufacturing cost can be reduced. Thus, this aspect is advantageous.

When the semiconductor device 100 to be measured is a switching element such as a MOSFET including the case where the detection target part 300 is used, the current changes when switching between ON and OFF, so that it is advantageous to employ the quasi Rogowski coil and the Rogowski coil in the present embodiment.

When as shown in FIGS. 3(a) and 3(b), an aspect is employed in which the height positions of the first straight part 11, the second straight part 12, and the sixth straight part 16 of the winding wire part 10, and the height position of the winding return wire part 50 are the same, this is advantageous in that the same steps can be used for these as shown in FIGS. 7 and 8. That is, this is advantageous in that a forming process can be performed by stacking the conductive material 95 on the upper face of the first insulating film 91 (see FIG. 7) and etching the conductive material 95 (see FIG. 8).

By employing this embodiment, the winding return wire part 50 can be positioned outward of the periphery of the winding wire part 10. This is advantageous in that the winding wire part 10 can be disposed as close as possible to the current flowing between the first electrode 61 and the second electrode 62.

Figure 11:
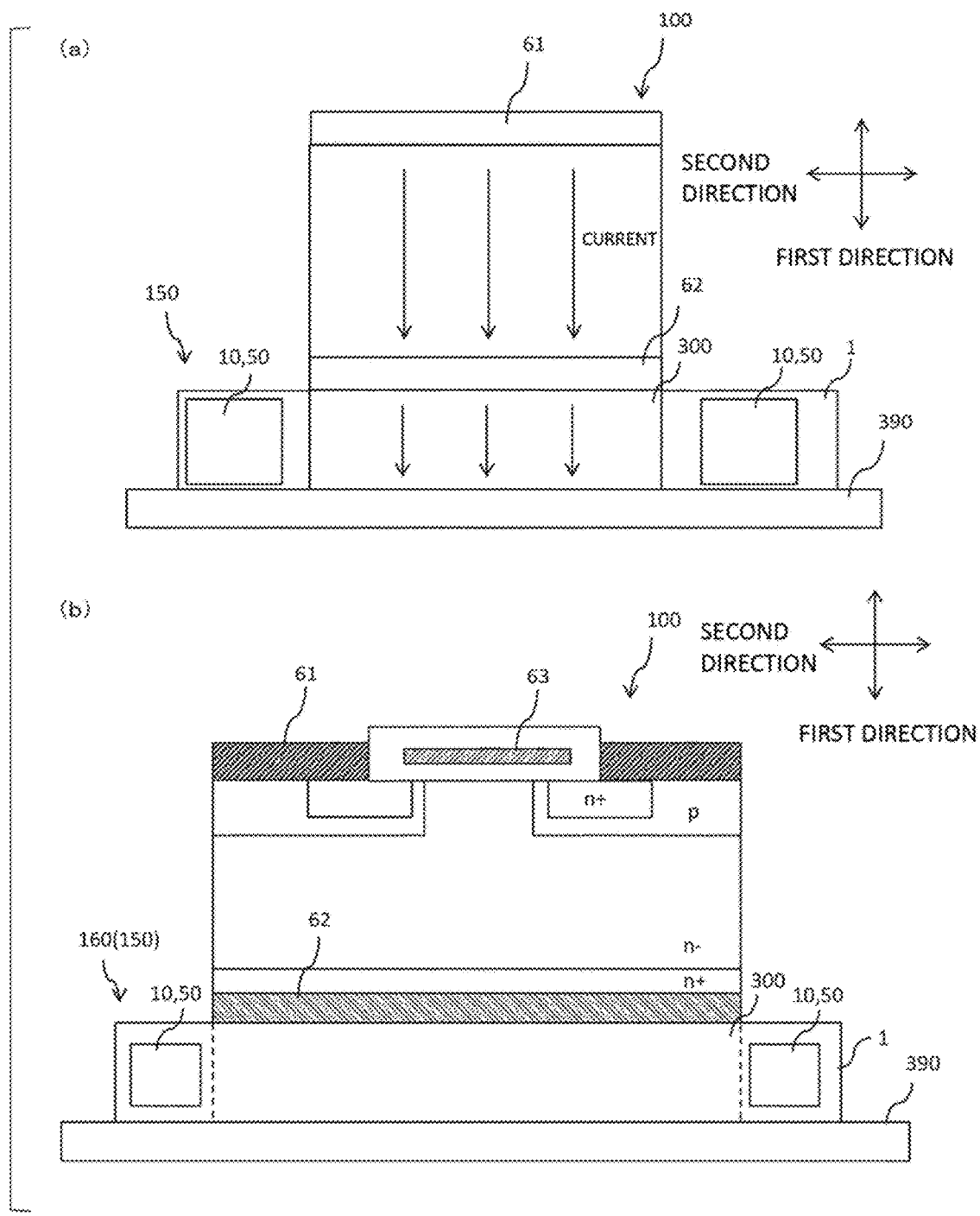
FIG. 11(a) is a longitudinal sectional view of a semiconductor component and a detection target part that can be used in the first embodiment of the present invention.
FIG. 11(b) is a longitudinal sectional view of another semiconductor component and another detection target part which can be used in the first embodiment of the present invention.

When an aspect is employed in which the detection target part 300 in which part or all of the current flowing in the semiconductor device 100 as shown in FIG. 11 flows is used as an object to be measured, this is advantageous in that the current flowing in the semiconductor device 100 can be measured indirectly even when it is difficult to directly measure the current flowing in the semiconductor device 100 due to a positional relationship or the like.

As shown in FIG. 11(a), according to the aspect in which the first electrode 61 or the second electrode 62 is placed, the plate-shaped or sheet-shaped detection target part 300 that allows current from the electrodes 61 and 62 to flow between the first main surface and the second main surface is provided, and the semiconductor component 150 is provided so as to surround the detection target part 300, this is advantageous in that the current flowing in the semiconductor device 100 can be measured indirectly simply by placing the first electrode 61 or the second electrode 62 of the semiconductor device 100 so as to be connected to the detection target part 300.

Also, as shown in FIG. 11(b) when the semiconductor component 150 having a measurement target 300, and the winding wire part 10 and the winding return wire part 50 disposed to surround the measurement target 300 is used, as an example, when the flat plate-shaped part 160 having the measurement target 300, and the winding wire part 10 and the winding return wire part 50 disposed so as to surround the measurement target 300 is used, the positional relationship between the path (detection target part 300) through which current flows in the flat plate-shaped part 160, and the winding wire part 10 and the winding return wire part 50 can be determined in advance. For this reason, this is advantageous in that a change in current can be accurately measured.

Note that the aspect illustrated in FIG. 11 is an example, and it should be noted that the detection target part 300 may be disposed at any position as long as it can obtain a current from a detection target part such as the semiconductor device 100.

Second Embodiment

Next, a second embodiment of the present invention will be described.

In the first embodiment, an aspect in which the winding return wire part 50 is provided outward of the periphery of the winding wire part 10 is used, but in the second embodiment, an aspect in which the winding return wire part 50 is provided inward of the periphery of the winding wire part 10 is used. Otherwise, any configuration used in the first embodiment can be used in the second embodiment. The members described in the first embodiment are described with the same reference numerals.

Figure 12:
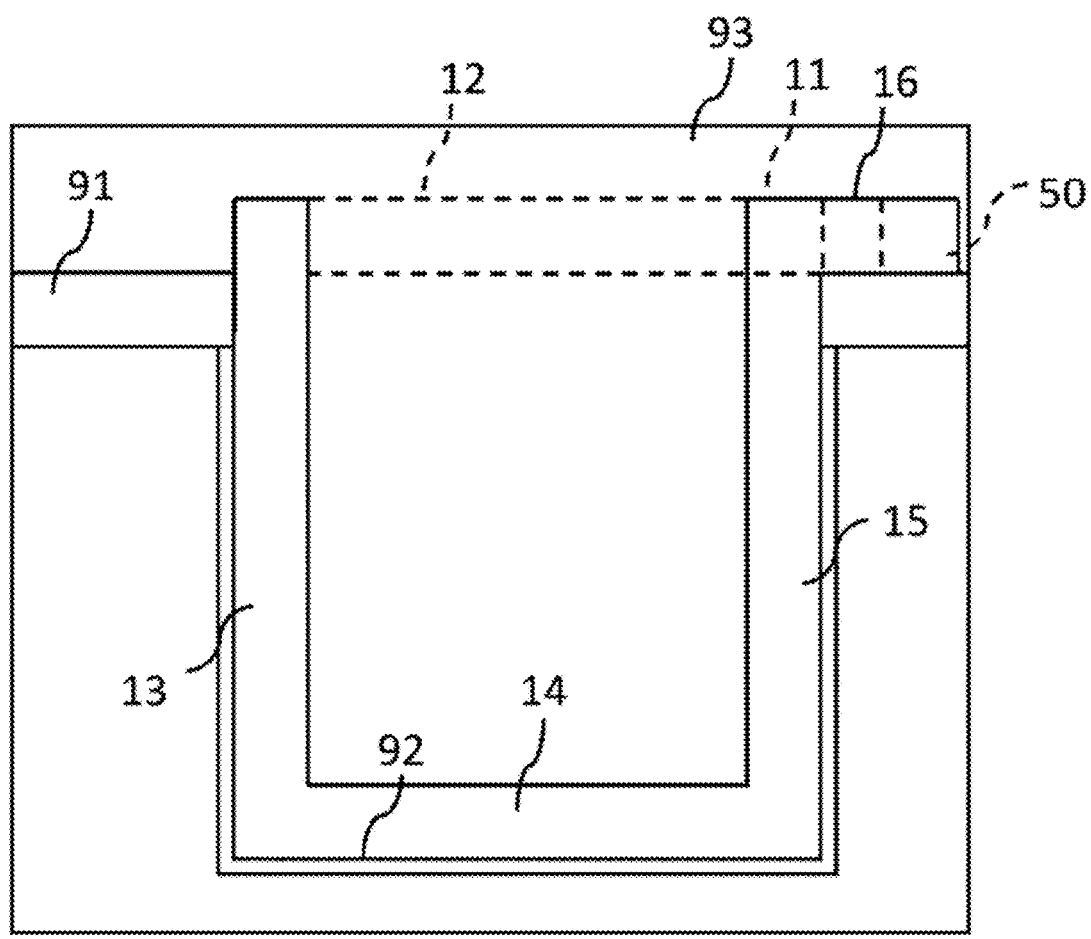
FIG. 12 is a longitudinal sectional view of a semiconductor component that can be used in a second embodiment of the present invention.

In the present embodiment, unlike the first embodiment, the semiconductor component may have the first straight part 11 along the winding direction, the second straight part 12 extending toward the peripherally outward (left side in FIG. 12) from the end of the first straight part 11 and extending in the plane direction toward the winding direction, the third straight part 13 extending from one side toward the other side from the end of the second straight part 12, the fourth straight part 14 extending toward the peripherally inward (right side in FIG. 12) from the end of the third straight part 13 and extending toward the direction perpendicular to the winding direction, and the fifth straight part 15 extending from the other side toward one side from the end of the fourth straight part 14 (third aspect) (see FIG. 12). The sixth straight part 16 extending in the plane direction toward the peripherally inward (right side in FIG. 12) from the end of the fifth straight part 15 may be provided at the terminal end part of the winding wire part 10, and the end of the sixth straight part 16 and the starting end part of the winding return wire part 50 may be connected. The winding return wire part 50 may extend in the plane direction.

Alternatively, unlike the aspect described above, the winding wire part 10 may have: a first straight part 11 along the winding direction; a second straight part 12 extending from the end of the first straight part 11 toward the peripherally outward and extending in the plane direction along the winding direction; a third straight part 13 extending from the other side toward one side from the end of the second straight part 12; a fourth straight part 14 extending from the end of the third straight part 13 toward the peripherally inward and extending along the direction perpendicular to the winding direction; and a fifth straight part 15 extending from one side toward the other side from the end of the fourth straight part 14 (fourth aspect). Further, a sixth straight part 16 extending from the end of the fifth straight part 15 toward the peripherally inward in the plane direction may be provided at the terminal end part of the winding wire part 10, and the end of the sixth straight part 16 and the starting end part of the winding return wire part 50 may be connected to each other. The winding return wire part 50 may extend in the plane direction.

Considering that the manufacturing method used in the first embodiment is adopted, it is advantageous to use the third aspect described firstly instead of the fourth aspect described secondly, because the winding return wire can be positioned on one side, which leads to a simplified manufacturing process.

When the present embodiment is used, the winding wire part 10 can be positioned outward of the periphery of the winding return wire part 50. Therefore, the length of the winding wire part 10 can be increased, and the number of turns of the winding wire part 10 can be increased. As a result, it is expected that the accuracy in detecting the change in current can be improved, which is advantageous.

Third Embodiment

Next, a third embodiment of the present invention will be described.

Figure 13:
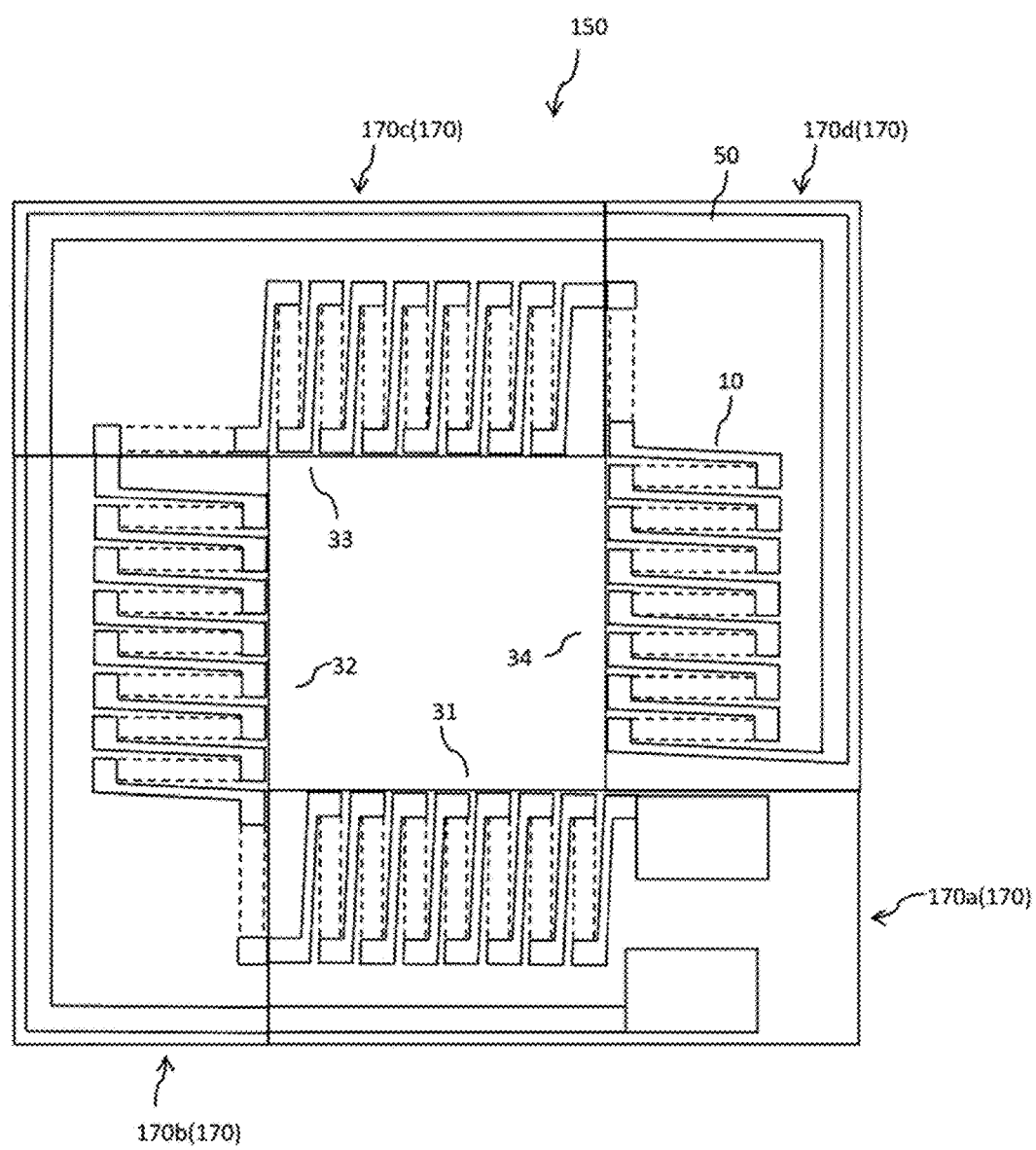
FIG. 13 is a plan view of a semiconductor component that can be used in a third embodiment of the present invention.
Figure 14:
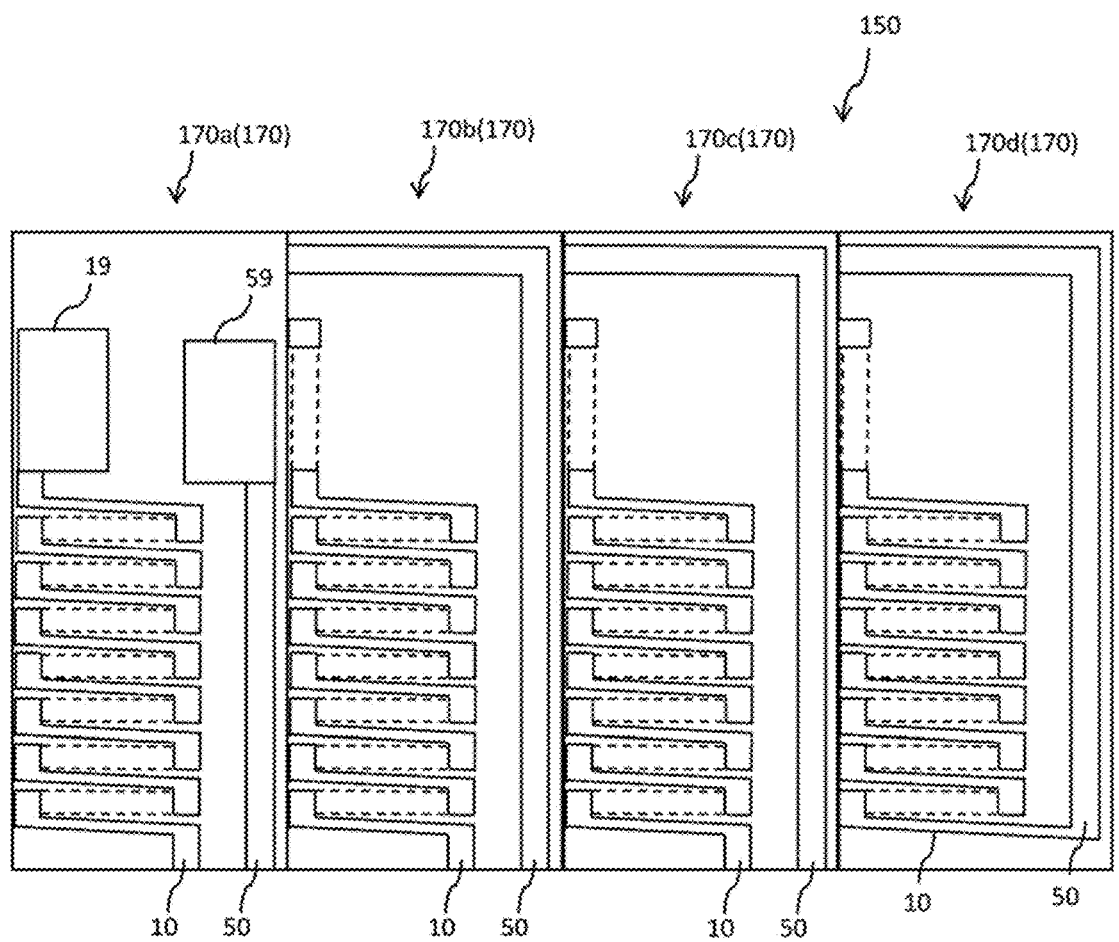
FIG. 14 is a plan view showing an aspect when the semiconductor component shown in FIG. 13 is manufactured.

In the third embodiment, as shown in FIGS. 13 and 14, the semiconductor component 150 has a plurality of measurement units 170 (170*a* to 170*d*), and each measurement unit 170 has the winding wire part 10 and the winding return wire part 50. The terminal end part of the winding wire part 10 of one measurement unit 170 (for example, the first measurement unit 170*a*) is connected to the starting end part of the winding wire part 10 of another measurement unit 170 (for example, the second measurement unit 170*b*), and the starting end part of the winding return wire part 50 of the one measurement unit 170 (for example, the first measurement unit 170*a*) is connected to the terminal end part of the winding return wire part 50 of the other measurement unit 170 (for example, the second measurement unit 170*b*). Otherwise, any configuration used in each of the above embodiments can be used in this embodiment. The members described in the above embodiments will be described with the same reference numerals.

When the aspect of this embodiment is used, as shown in FIG. 14, this is advantageous in that the semiconductor layer 1 such as a wafer can be used without waste. That is, in the aspect described in the above-described embodiment, there are portions, of the semiconductor layer 1, that are discarded without being used and portions that are used but have no electrical function. On the other hand, the present embodiment is advantageous in that the semiconductor layer 1 is used with waste as little as possible in order to generate the winding wire part 10 and the winding return wire part 50.

Any connection means such as laser welding, ultrasonic bonding, and solder welding can be used for the connection between the terminal end part of the winding wire part 10 of one measurement unit 170 and the starting end part of the winding wire part 10 of another measurement unit 170, and the connection between the starting end part of the winding return wire part 50 of one measurement unit 170 and the terminal end part of the winding return wire part 50 of another measurement unit 170. Also, the terminal end part of the winding wire part 10 of one measurement unit 170 and the starting end part of the winding wire part 10 of another measurement unit 170, and the starting end part of the winding return wire part 50 of one measurement unit 170 and the terminal end part of the winding return wire part 50 of another measurement unit 170 may be connected by a wire or a connector. In addition, the electrode pad electrically connected to the starting end part of the winding wire part 10 of the measurement unit 170 and the terminal end part of the winding wire part 10 of the measurement unit 170 may be provided on the front surface of the measurement unit 170 (for example, the front surface of paper of FIG. 14). The electrode pad is electrically connected to the conductor layer provided on the substrate 390, so that the terminal end part of the winding wire part 10 of one measurement unit 170 and the starting end part of the winding wire part 10 of another measurement unit 170 may be electrically connected, and further, the starting end part of the winding return wire part 50 of one measurement unit 170 and the terminal end part of the winding return wire part 50 of another measurement unit 170 may be electrically connected.

As shown in FIGS. 13 and 14, the measurement unit 170 may have a columnar shape, for example, a prismatic shape, or a cylindrical shape. Considering that the measurement unit 170 is disposed at a fixed position on the substrate 390 or the like, it is advantageous that the measurement unit 170 has a prismatic shape.

Figure 15:
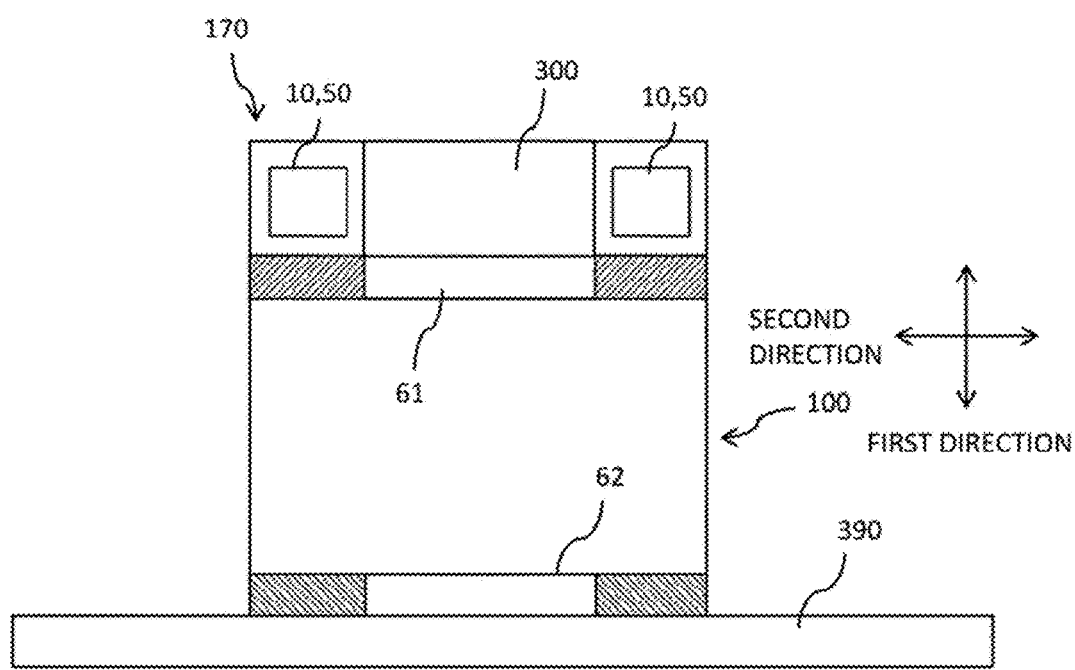
FIG. 15 is a longitudinal sectional view of a semiconductor component and a detection target part that can be used in a third embodiment of the present invention.

Further, as described in the first embodiment, an object to be measured does not need to be the semiconductor device 100, but may be the detection target part 300 through which at least part of the current flowing in the semiconductor device 100 flows. In addition to the aspects already described, for example, the detection target part 300 may extend along the first direction from the first electrode 61 or the second electrode 62, and a plurality of measurement units 170 may be disposed so as to surround the detection target part 300. More specifically, as shown in FIG. 15, the detection target part 300 may extend from the second electrode 62 along the first direction, and a plurality of measurement units 170 may be disposed so as to surround the detection target part 300.

Although the present embodiment has been described using an aspect using four measurement units 170, the present invention is not limited to this, and two, three, or five or more measurement units 170 may be used.

Note that the measurement unit 170 shown in FIGS. 13 and 14 has the first measurement unit 170a having the starting end part of the winding wire part 10 and the terminal end part of a winding return wire part 50, the second measurement unit 170b connected to the first measurement unit 170a, a third measurement unit 170c connected to the second measurement unit 170b, and a fourth measurement unit 170d connected to the third measurement unit 170c and having the terminal end part of the winding wire part 10 and the starting end part of the winding return wire part 50. Further, the second measurement unit 170b and the third measurement unit 170c have the same configuration.

Fourth Embodiment

Next, a fourth embodiment of the present invention will be described.

Figure 16:
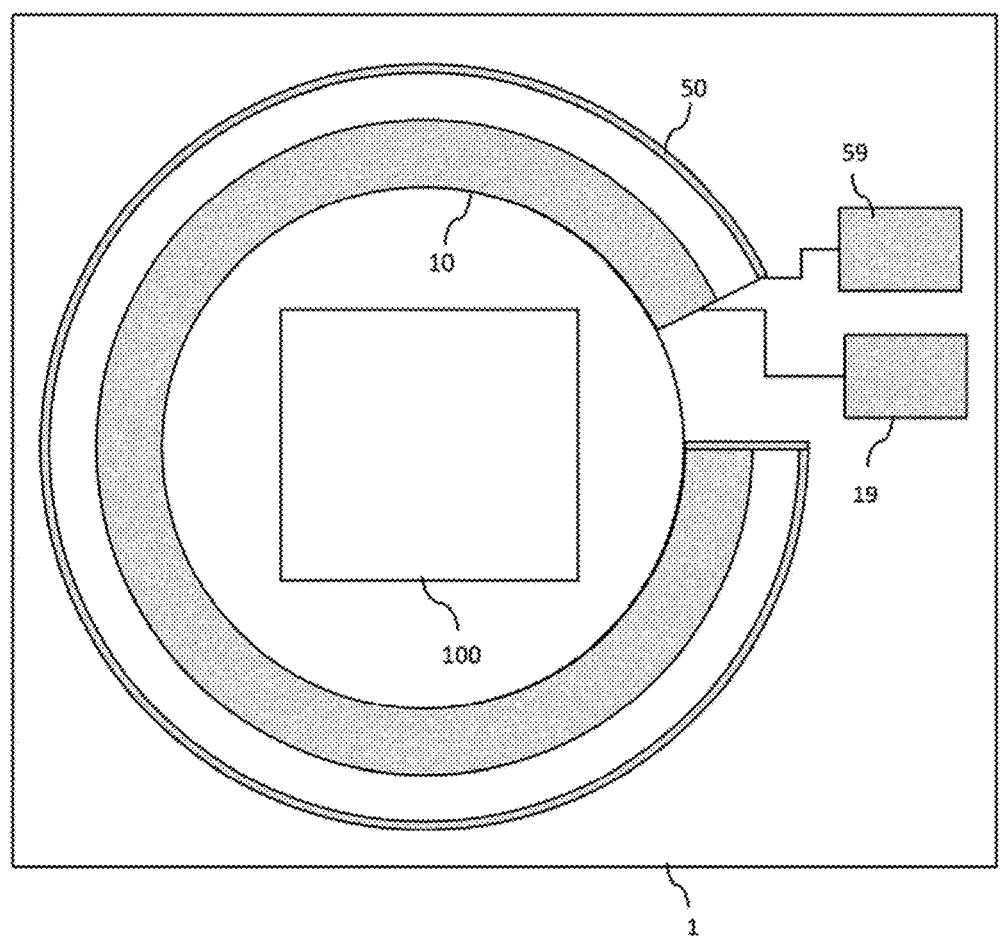
FIG. 16 is a plan view of a semiconductor component that can be used in a fourth embodiment of the present invention.
Figure 16:
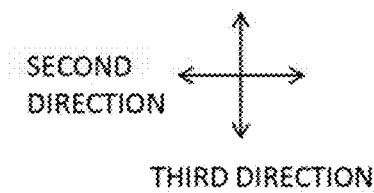

The above respective embodiments have described the aspect in which the winding wire part 10 has the A-direction winding wire part 31 extending in the second direction, the B-direction winding wire part 32 connected to the end of the A-direction winding wire part 31 and extending in the third direction, the C-direction winding wire part 33 connected to the end of the B-direction winding wire part 32 and extending in the second direction, and the D-direction winding wire part 34 connected to the end of the C-direction winding wire part 33 and extending in the third direction. However, the present invention is not limited thereto. As an example, each of the winding wire part 10 and the winding return wire part 50 may have a circular shape in a plan view (in a plane including the second direction and the third direction) as shown in FIG. 16. Alternatively, each of the winding wire part 10 and the winding return wire part 50 may have a triangular shape in a plan view. For the other configurations, any configurations adopted in the above respective embodiments can also be adopted in the present embodiment. The members described in each of the above respective embodiments will be described with the same reference numerals.

When the aspect shown in FIG. 16 is adopted, balanced detection of the current flowing between the first electrode 61 and the second electrode 62 can be expected. In view of facilitating the manufacturing process, it is advantageous to use an aspect in which straight shaped parts such as the A-direction winding wire part 31, the B-direction winding wire part 32, the C-direction winding wire part 33, and the D-direction winding wire part 34 as in the first embodiment or the second embodiment are connected to each other.

Fifth Embodiment

Next, a fifth embodiment of the present invention will be described.

In the above respective embodiments, both of the winding wire part 10 and the winding return wire part 50 are provided in one semiconductor layer 1. In contrast, in the present embodiment, only the winding wire part 10 is provided in the semiconductor layer 1 on which the first electrode 61 and the second electrode 62 are provided, and the winding return wire part 50 is provided in another semiconductor layer or another member. For the other configurations, any configurations adopted in the above respective embodiments can also be adopted in the present embodiment. The members described in each of the above respective embodiments will be described with the same reference numerals.

Further, the winding return wire part 50 and the winding wire part 10 are provided around the semiconductor device 100 or the detection target part 300, but the winding wire part 10 may be provided inward of the periphery of or may be provided outward of the periphery of the winding return wire part 50.

Figure 17:
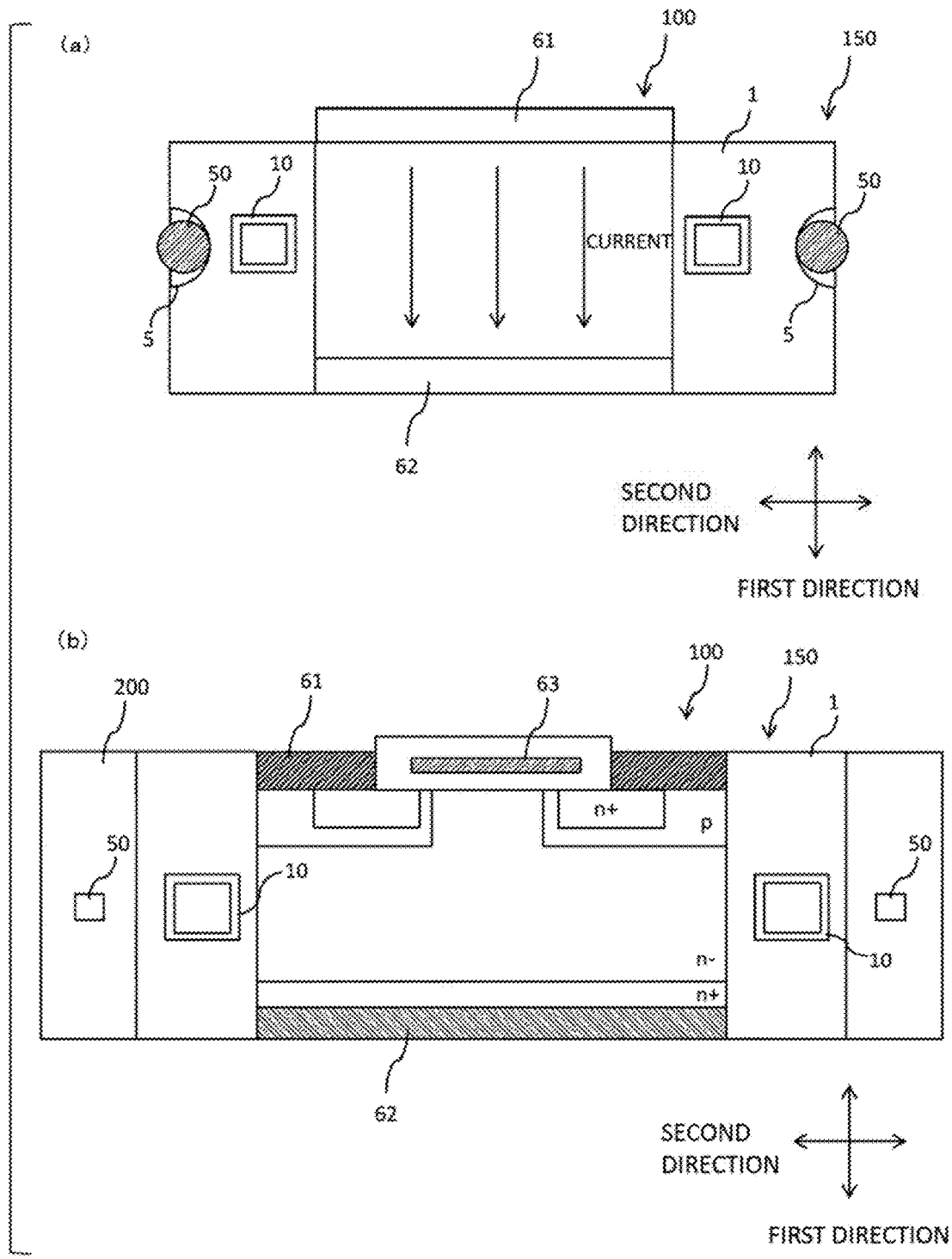
FIG. 17(a) is a longitudinal sectional view of a semiconductor component that can be used in a fifth embodiment of the present invention.
FIG. 17(b) is a longitudinal sectional view of another semiconductor component that can be used in the fifth embodiment of the present invention.

As an example, as shown in FIG. 17(a), the winding return wire part 50 may be made of a metal wire, and may be disposed to surround the periphery of the semiconductor component 150. In this case, a groove 5 for positioning the winding return wire part 50 on the side wall of the semiconductor component 150 may be provided.

Also, as shown in FIG. 17(b) the winding return wire part 50 may be formed in a semiconductor layer 200 different from the semiconductor layer 1 in which the winding wire part 10 is provided, and the other semiconductor layer 200 may be provided so as to surround the semiconductor layer 1 in which the winding wire part 10 is provided.

Sixth Embodiment

Next, a sixth embodiment of the present invention will be described.

In the above respective embodiments, one quasi Rogowski coil or Rogowski coil is provided. In contrast, in the present embodiment, a plurality of quasi Rogowski coils or Rogowski coils are provided. For the other configurations, any configurations adopted in the above respective embodiments can also be adopted in the present embodiment. The members described in each of the above respective embodiments will be described with the same reference numerals.

Figure 18:
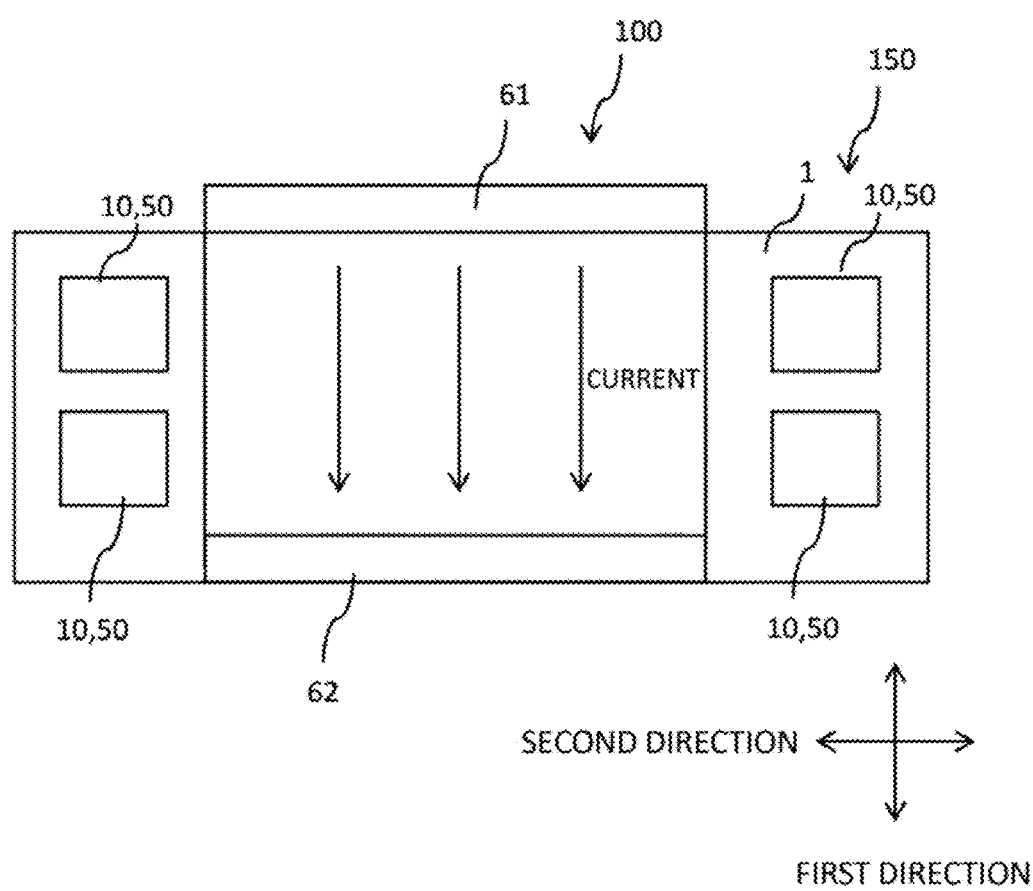
FIG. 18 is a longitudinal sectional view of a semiconductor component that can be used in a sixth embodiment of the present invention.

As shown in FIG. 18, quasi Rogowski coils or Rogowski coils may be aligned in the first direction in the semiconductor layer 1 of the semiconductor component 150. More specifically, the winding wire part 10 and the winding return wire part 50 which does not pass through the winding wire part 10 (a quasi Rogowski coil), or the winding wire part 10 and the winding return wire part 50 passing through the winding wire part 10 (Rogowski coil) may be aligned in the first direction. When this aspect is adopted, a change in current can be detected at two or more locations in the first direction, which is advantageous in that a change in current can be detected more accurately. However, in this aspect, it should be noted that, since the winding wire part 10 and the winding return wire part 50 need to be arranged so as to be stacked in the first direction, the manufacturing process becomes complicated as compared with the first embodiment.

Figure 19:
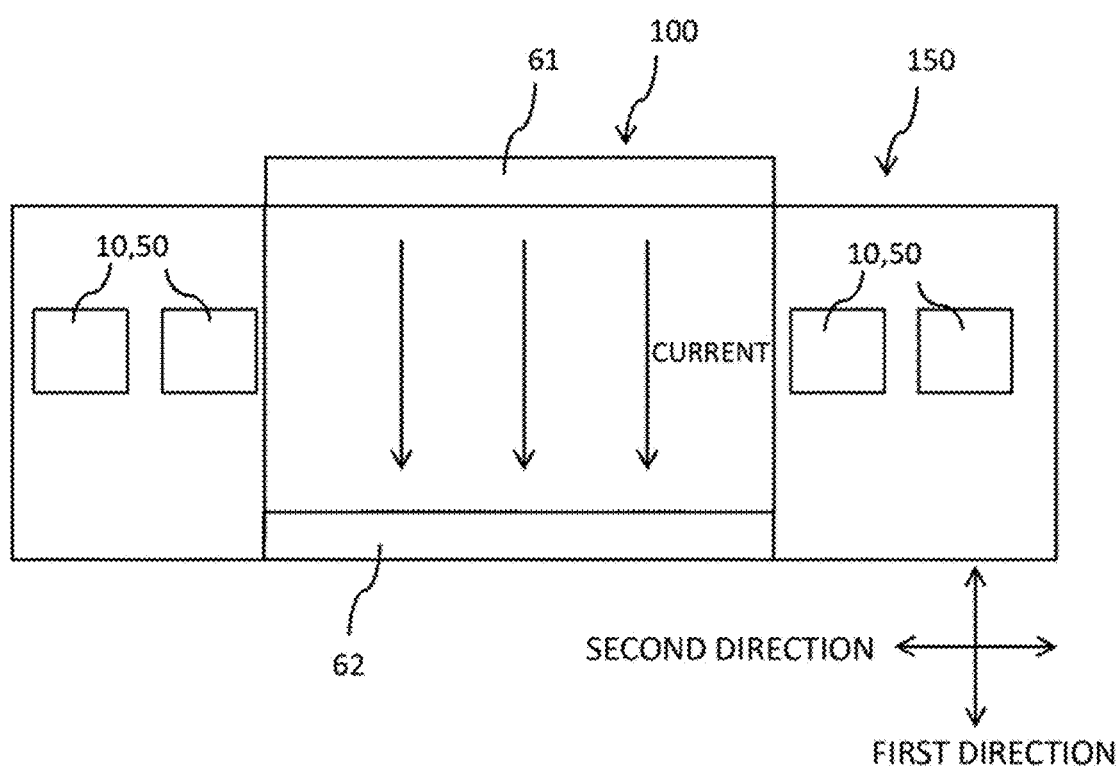
FIG. 19 is a longitudinal sectional view of another semiconductor component that can be used in the sixth embodiment of the present invention.

As shown in FIG. 19, another quasi Rogowski coil or Rogowski coil may be disposed on the outer peripheral side of the quasi Rogowski coil or Rogowski coil. More specifically, the winding wire part 10 and the winding return wire part 50 which does not pass through the winding wire part 10 (quasi Rogowski coil), or the winding wire part 10 and the winding return wire part 50 passing through the winding wire part 10 (Rogowski coil) may be aligned in the second direction or the third direction. When this aspect is adopted, a change in current can also be detected more accurately, which is advantageous. In addition, this aspect is also advantageous in that the similar manufacturing process as that of the first embodiment can be employed.

Figure 20:
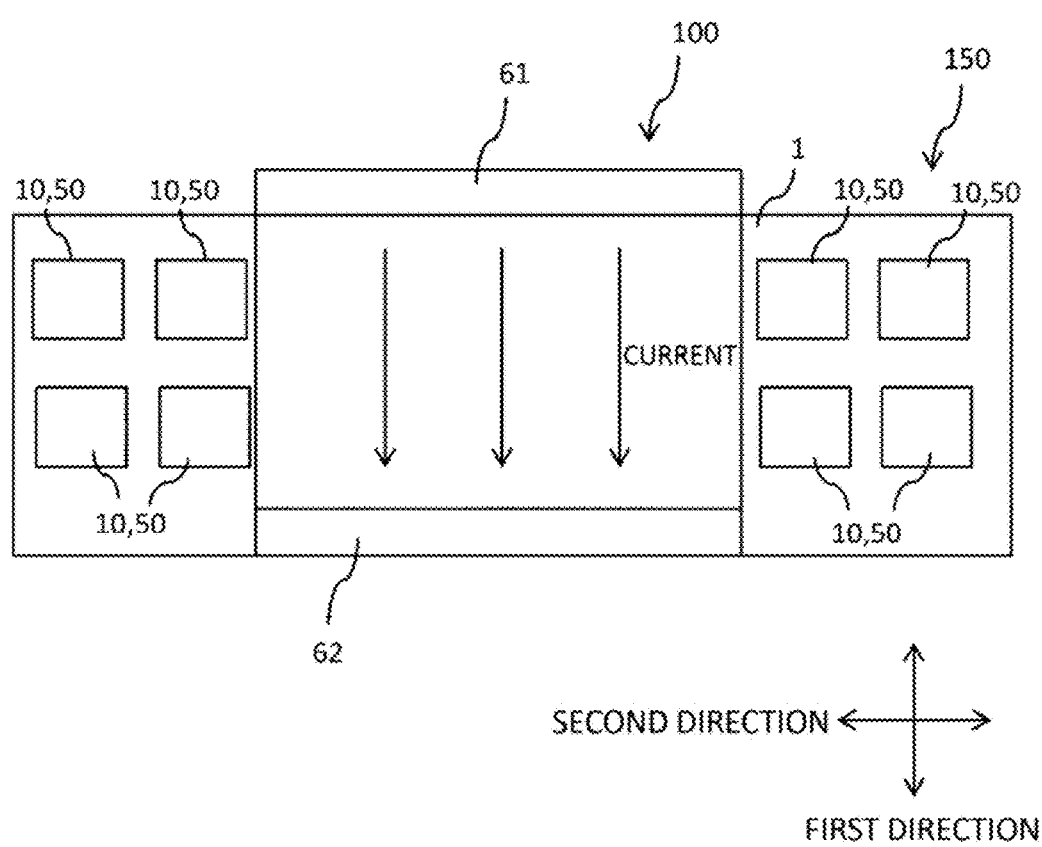
FIG. 20 is a longitudinal sectional view of still another semiconductor component that can be used in the sixth embodiment of the present invention.

These aspects may be combined, and as shown in FIG. 20, the quasi Rogowski coils or Rogowski coils may be stacked in the first direction, and other quasi Rogowski coils or Rogowski coils may be provided on the outer peripheral side of the quasi Rogowski coils or Rogowski coils. More specifically, the winding wire parts 10 and the winding return wire parts 50 which do not pass through the winding wire parts 10 (quasi Rogowski coils), or the winding wire parts 10 and the winding return wire parts 50 passing through the winding wire parts 10 (Rogowski coils) may be aligned in the second direction or the third direction, and also aligned in the first direction.

When the measurement unit 170 as shown in FIGS. 13 to 15 is used, an aspect similar to the aspect shown in FIG. 18 can be realized by arranging the measurement units 170 so as to be stacked in the first direction, and an aspect similar to the aspect shown in FIG. 19 can be realized by arranging the measurement units 170 side by side in the plane direction. Further, when such measurement units 170 are used, this is advantageous in that a similar manufacturing process in which sizes of the measurement units 170 are the same or different can be used.

The foregoing descriptions of the embodiments and the disclosure of the drawings are merely one example for describing the present invention recited in the claims. The present invention recited in the claims shall not be limited by the foregoing descriptions of the embodiments and the disclosure of the drawings. Further, the recitations of the claims at the time of the filing of the present application are merely an example, and the recitations of the claims can be changed as appropriate based on the description of the specification, the drawings, and the like.

REFERENCE SIGNS LIST

1 semiconductor layer
10 winding wire part
50 winding return wire part
61 first electrode
62 second electrode
91 first insulating film
92 second insulating film
93 third insulating film
100 semiconductor device
150 semiconductor component
160 flat plate-shaped part (semiconductor component)
170 measurement unit (semiconductor component)
300 detection target part

The invention claimed is:

1. A semiconductor component comprising:
a semiconductor layer including a winding wire part and a winding return wire part connected at a terminal end part of the winding wire part and returning from the terminal end part toward a starting end part side, wherein
the semiconductor component is disposed so as to surround an object to be measured, and
the winding wire part is embedded in the semiconductor layer.

2. The semiconductor component according to claim 1, wherein
the winding return wire part does not pass through the winding wire part.

3. The semiconductor component according to claim 2, wherein
the semiconductor component has a plurality of measurement units,
each measurement unit has the winding wire part and the winding return wire part,
the terminal end part of the winding wire part of one measurement unit is connected to the starting end part of the winding wire part of another measurement unit, and
the starting end part of the winding return wire part of the one measurement unit is connected to the terminal end part of the winding return wire part of the other measurement unit.

4. The semiconductor component according to claim 2, wherein
the object to be measured is a detection target part, through which at least a part of current flowing in an electronic device flows, and
the semiconductor component is disposed so as to surround the detection target part.

5. The semiconductor component according to claim 2, wherein
the object to be measured is a detection target part, through which at least a part of current flowing in an electronic device flows, and
the semiconductor component has the detection target part, and the winding wire part and the winding return wire part, which are disposed so as to surround the detection target part.

6. The semiconductor component according to claim 1, wherein
the object to be measured is a detection target part, through which at least a part of current flowing in an electronic device flows, and
the semiconductor component is disposed so as to surround the detection target part.

7. The semiconductor component according to claim 1, wherein
the object to be measured is a detection target part, through which at least a part of current flowing in an electronic device flows, and
the semiconductor component has the detection target part, and the winding wire part and the winding return wire part, which are disposed so as to surround the detection target part.

8. A semiconductor component comprising:
a semiconductor layer including a winding wire part and a winding return wire part connected at a terminal end part of the winding wire part and returning from the terminal end part toward a starting end part side, wherein
the semiconductor component is disposed so as to surround an object to be measured,
the semiconductor component has a plurality of measurement units,
each measurement unit has the winding wire part and the winding return wire part,
the terminal end part of the winding wire part of one measurement unit is connected to the starting end part of the winding wire part of another measurement unit, and the starting end part of the winding return wire part of the one measurement unit is connected to the terminal end part of the winding return wire part of the other measurement unit.

9. The semiconductor component according to claim 8, wherein
the measurement unit has a columnar shape.

10. The semiconductor component according to claim 9, wherein
the object to be measured is an electronic device, and
a plurality of measurement units are disposed so as to laterally surround the electronic device.

11. The semiconductor component according to claim 9, wherein
the object to be measured is a detection target part, through which at least a part of current flowing in an electronic device flows, and
the semiconductor component is disposed so as to surround the detection target part.

12. The semiconductor component according to claim 8, wherein
the object to be measured is an electronic device, and
a plurality of measurement units are disposed so as to laterally surround the electronic device.

13. The semiconductor component according to claim 12, wherein
the object to be measured is a detection target part, through which at least a part of current flowing in an electronic device flows, and
the semiconductor component is disposed so as to surround the detection target part.

14. The semiconductor component according to claim 8, wherein
the object to be measured is a detection target part, through which at least a part of current flowing in an electronic device flows, and
the semiconductor component is disposed so as to surround the detection target part.

15. An assembly comprising:
a semiconductor component, which has a semiconductor layer including a winding wire part and is disposed so as to surround an object to be measured; and
a winding return wire connected at a terminal end part of the winding wire part and returning from the terminal end part toward a starting end part side,
wherein the winding wire part is embedded in the semiconductor layer.

16. A method of manufacturing a semiconductor component, comprising steps of:
forming a first insulating film partially on a semiconductor layer;
forming a trench using the first insulating film;
forming a second insulating film on an inner side wall and an inner bottom surface of the trench;
providing a conductive material in the trench where the second insulating film is formed and on one side of the semiconductor layer;
forming a winding wire part and a winding return wire part inward or outward of a periphery of the winding wire part by patterning the conductive material; and
covering the winding wire part and the winding return wire part with a third insulating film.

* * * * *